United States Patent
Giles

(10) Patent No.: US 7,662,680 B2
(45) Date of Patent: Feb. 16, 2010

(54) METHOD OF PRODUCING A SEMICONDUCTOR ELEMENT IN A SUBSTRATE AND A SEMICONDUCTOR ELEMENT

(75) Inventor: Luis-Felipe Giles, Munich (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 11/864,517

(22) Filed: Sep. 28, 2007

(65) Prior Publication Data

US 2009/0085035 A1 Apr. 2, 2009

(51) Int. Cl.
*H01L 21/00* (2006.01)
(52) U.S. Cl. ............... 438/162; 438/520; 257/E21.319; 257/E21.324
(58) Field of Classification Search ......... 438/473, 438/514, 520, 522, 532, 162, 528, 530; 257/E21.319, 257/E21.324
See application file for complete search history.

(56) References Cited

U.S. PATENT DOCUMENTS

| 2007/0161219 A1 | 7/2007 | Giles |
| 2008/0149929 A1 | 6/2008 | Giles |
| 2009/0057678 A1* | 3/2009 | Goldbach et al. ............ 257/66 |

FOREIGN PATENT DOCUMENTS

DE 10 2005 054 218 A1 5/2007

OTHER PUBLICATIONS

Clark, Mark H., et al., "Effects of amorphizing species' ion mass on the end-of-range damage formation in silicon," Applied Physics Letters, Jun. 3, 2002, pp. 4163-4165, vol. 80, No. 22, American Institute of Physics.
Cowern, N.E.B., et al., "Physics-Based Diffusion Simulations for Preamorphized Ultrashallow Junctions," Mat. Res. Soc. Symp. Proc, 2003, 6 pages, vol. 675.
Duffy, R., et al., "Boron diffusion in amorphous silicon and the role of fluorine," Applied Physics Letters, May 24, 2004, pp. 4283-4285, vol. 84, No. 21, American Institute of Physics.
Duffy, R., et al., "Boron uphill diffusion during ultrashallow junction formation," Applied Physics Letters, May 26, 2003, pp. 3647-3649, vol. 82, No. 21, American Institute of Physics.
Lerch, W., et al., "Advanced activation of ultra-shallow junctions using flash-assisted RTP," Materials Science & Engineering B, 2005, pp. 24-31, Elsevier B.V.
Giles, L. F., et al., "On the Role of Nanocavities in Suppressing Boron Transient Enhanced Diffusion and Deactivation in F+ Coimplanted Silicon," Journal of Applied Physics, vol. 103, May 23, 2008, 8 pages, American Institute of Physics.

* cited by examiner

*Primary Examiner*—Quoc D Hoang
(74) *Attorney, Agent, or Firm*—Slater & Matsil, L.L.P.

(57) ABSTRACT

A method of producing a semiconductor element in a substrate includes forming a plurality of micro-cavities and carbide precipitates in the substrate, creating an amorphization of the substrate to form crystallographic defects and a doping of the substrate with doping atoms, annealing the substrate such that at least a part of the crystallographic defects are eliminated using the micro-cavities and the carbide precipitates, and wherein the semiconductor element is formed using the doping atoms.

33 Claims, 30 Drawing Sheets

Forming at least two bands of a plurality of one of micro-cavities and carbide precipitates —101

Creating an amorphization and a doping of the substrate —105

Annealing the substrate —115

METHOD OF PRODUCING A SEMICONDUCTOR ELEMENT IN A SUBSTRATE AND A SEMICONDUCTOR ELEMENT

BACKGROUND

The following relates to a method of producing a semiconductor element and to a semiconductor element.

BRIEF DESCRIPTION OF THE DRAWINGS

In the following description, various embodiments of the invention are described with reference to the following drawings. In the figures, like reference characters generally refer to the same parts throughout the different views. The drawings are not necessarily to scale, emphasis instead generally being placed upon illustrating the principles of the invention.

DETAILED DESCRIPTION OF ILLUSTRATIVE EMBODIMENTS

Figure 1:
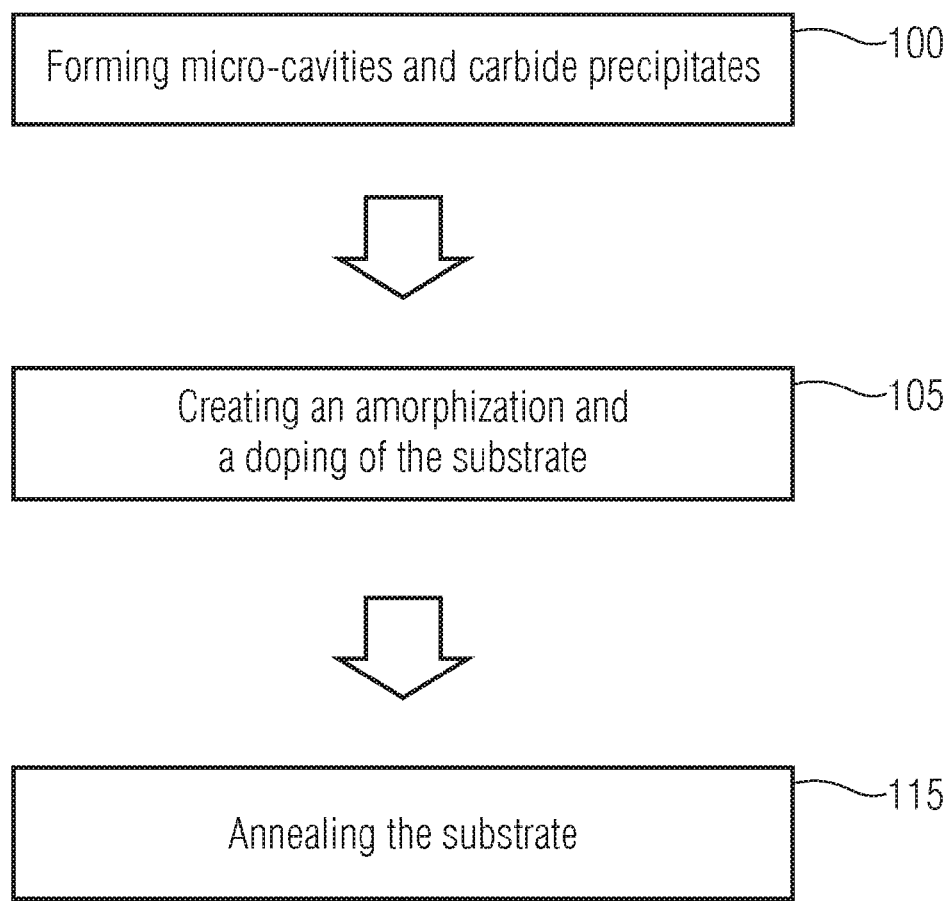
FIG. 1 shows a flow chart of a method of producing a semiconductor element in a substrate by forming a plurality of micro-cavities and carbide precipitates in the substrate.

With reference to the accompanying FIGS. 1-21, explanations and embodiments relating to a method of producing a semiconductor element in a substrate and a semiconductor element produced therewith will be described in detail below.

Current techniques to achieve shallow junctions in semiconductor devices or elements include implanting low energy boron (B) or boron fluoride ($BF_2$) as dopants into germanium (Ge) pre-amorphized silicon layers. In order to anneal the implantation damage and activate the dopants, a subsequent high temperature annealing step (T≧1300° C.) using ultra fast techniques such as laser and flash annealing may be carried out. These methods usually involve dopant deactivation during subsequent low temperature processes as well as an undesirable transient enhanced diffusion (TED).

It is now widely accepted that both the dopant deactivation and TED are caused by a self interstitial super saturation produced by the implantation process itself.

In the context of this application, the term "self interstitial" refers to a specific type of a one dimensional point effect in a crystal lattice. In particular, a self interstitial is meant to be an atom lodged in a position between normal lattice atoms, so there is an interstice. The term "self" indicates that the interstitial atom is of the same type as the normal lattice atoms. For example, in a silicon substrate, a self interstitial would refer to a silicon atom sitting at the interstitial. In the following description, the terms "self interstitial", "interstitial", and "interstitial type defects" are used interchangeably.

Interstitial type defects or interstitials forming crystallographic defects are described herein.

For producing a semiconductor element, neither the deactivation of the doping atoms, for example, boron atoms, nor the transient enhanced diffusion is desirable. The doping deactivation at low temperature occurs due to the formation of immobile dopant interstitial clusters. The source of interstitials, which is required for the formation of dopant interstitial clusters has to be seen in the end of range defects located close to the original interface between the amorphous region and the crystalline region of the substrate. The depth of the amorphous region in a substrate depends on the exact conditions of the pre-amorphization.

The interstitial type defects at the amorphous/crystalline silicon interface are also termed end of range defects (EOR).

One way to eliminate both phenomena mentioned above, i.e., TED and dopant deactivation, is to completely suppress the source of interstitials. Conventional methods to reduce TED and dopant deactivation include cocktail implants of $BF_2$, carbon (C), fluorine (F) in conjunction with a Ge pre-amorphization. Since both fluorine and carbon are known to diffuse through an interstitial mechanism, the coupling of fluorine or carbon with interstitials may help to reduce the overall self interstitial super saturation responsible for TED. However, the cocktail implant approach is not able to suppress completely TED because it does not eliminate completely the source of the problem which, in fact, is the excess of interstitials located at the amorphous/crystalline interface.

As it is depicted in the flow chart of FIG. 1, a method of producing a semiconductor element comprises forming (step 100) a plurality of micro-cavities and carbon precipitates in the substrate, creating an amorphization of the substrate (step 105) to form crystallographic defects and a doping of the substrate with doping atoms. The method further comprises annealing (step 115) the substrate, such that at least a part of the crystallographic defects is eliminated, using the micro-cavities and the carbide precipitates and wherein the semiconductor element is formed using the doping atoms.

The micro-cavities in the substrate can be formed in different ways. For example, the forming of those micro-cavities can be done by implanting ions in the substrate. For example, by implanting hydrogen atoms with a dose higher than $10^{16}$ $cm^{-2}$ in a silicon substrate micro-cavities are formed therein. Instead of hydrogen ($H_2^+$)-ions, other ions, like helium ($He_2^+$)-ions, fluorine ($F^+$)-ions, neon ($Ne^+$)-ions, chlorine ($Cl^+$)-ions or argon ($Ar^+$)-ions can be used.

Figure 12:
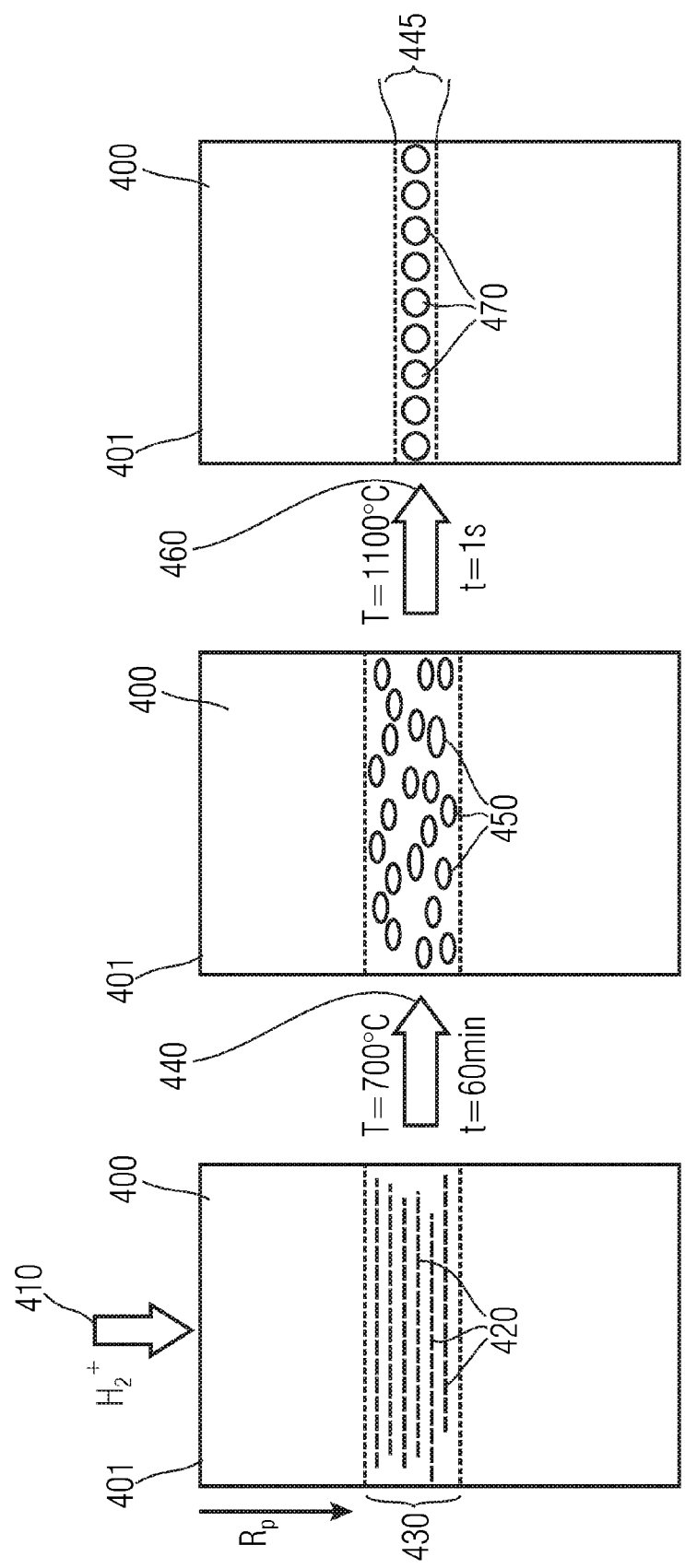
FIG. 12 shows a possibility to form micro-platelets, micro-cavities and a band of micro-cavities in a substrate.

Implanting ions in the substrate is an easy and reliable mechanism to form micro-cavities. The micro-cavities in the substrate may comprise, for example, in all three dimensions a size in the micrometer range. The extension of the micro-cavities can be, for example, in one or two dimensions in a micrometer range, and in the third dimension, in the nm range. However, the micro-cavities can also comprise an extension in the nm range in all three dimensions. In FIG. 12 an example for the forming of micro-cavities will be described in more detail.

The micro-cavities in the substrate may act as sinks for crystallographic defects or interstitials created during doping and amorphizing the substrate. The micro-cavities formed in the crystalline lattice of the substrate are temperature stable even by applying a high temperature step higher than about 1000° C. after forming the micro-cavities.

Furthermore, the micro-cavities can reduce the transient enhanced diffusion (TED) of the implanted doping atoms, which is usually caused by a self interstitial super saturation associated with the crystallographic defects.

Carbide precipitates may refer to silicon carbide (SiC) precipitates, for example, to the beta-SiC phase, also other carbide structures or phases may be included. The term carbide precipitates may also comprise any accumulation of carbon atoms in the lattice of the substrate, such as pure carbon clusters, or may even involve precipitates comprising oxygen atoms such as silicon-oxygen-carbon precipitates, for example.

According to one embodiment of the invention, silicon carbon precipitates are formed from carbon atoms implanted into a silicon substrate. For example, $C^+$-ions are implanted into the substrate, such that the plurality of carbide precipitates are formed in the substrate. The plurality of carbide precipitates may be formed in such a way, that they form a band of carbide precipitate, the carbide precipitates being separated from each other. A more detailed description of the forming of the carbide precipitates is given in the context of FIG. 11.

In accordance with one embodiment of the invention, the substrate comprises silicon. The substrate may be a silicon substrate, for example, a (100)-silicon substrate or a (111)-silicon substrate. The substrate may be a single crystalline substrate.

Creating an amorphization (step 105) of the substrate to form crystallographic defects and the doping of the substrate with doping atoms may comprise the use of amorphization ions for pre-amorphization of the substrate followed, for example, by low energy p-type dopant implantation. The amorphization of the substrate and the doping of the substrate may comprise implanting boron atoms, phosphorus atoms or arsenic atoms in the substrate. The implanting of boron atoms may comprise introduction of boron ions into the substrate, introducing boron fluoride ($BF_2$) or introducing boron clusters ($B_XH_Y$). Creating an amorphization of the substrate to form crystallographic defects can either be done by using amorphization ions for pre-amorphization the substrate followed by a doping with doping atoms or by a doping of the substrate with doping atoms which, apart from the doping, can also cause an amorphization of the substrate. As doping atoms, for example, boron atoms, phosphorus atoms or arsenic atoms may be used. Ions may be used for the pre-amorphization of the substrate. In accordance with an embodiment of the invention, germanium ($Ge^+$)-ions or silicon ions (Si)-ions may be used as pre-amorphization ions for the pre-amorphization. The pre-amorphization may be performed in such a way that the substrate is at least partially pre-amorphized. For example, according to one embodiment, a surface region of the substrate is pre-amorphized, for example, up to a depth of approximately 50 nm to 200 nm, e.g., 100 nm. In other words, a surface region of the substrate having a thickness of approximately 50 nm to 200 nm, e.g., 100 nm, is amorphized, while a substrate region below the amorphized region remains crystalline.

By means of implanting the amorphization ions, for example, germanium ($Ge^+$)-ions in the crystalline region of the substrate, crystallographic defects will be generated. So-called interstitials are formed close to the interface between the amorphous region and the crystalline region of the substrate, which may cause the deactivation of doping atoms and can give rise to a transient enhanced diffusion in the substrate. Due to the allocation, close to the interface between the amorphous region and the crystalline region of the substrate, the interstitials are also called "end of range" defects (EOR).

The annealing, i.e., the heating of the substrate (step 115), is performed in order to re-crystallize at least a part of the amorphized region within the scope of the solid-phase epitaxial regrowth (SPER). By means of the SPER, at least a part of the interstitials can be annealed. However, normally there are still interstitials respectively, end of range defects, left at the border between the amorphous region and the crystalline region of the substrate. Nevertheless, in the method for forming a semiconductor element, the end of range defects can be reduced or eliminated by the implanted micro-cavities and carbide precipitates. The annealing within the scope of the SPER process can be performed, for example, at a temperature lower than about 650° C. or lower than about 580° C. But it is also feasible to perform the annealing for example at a temperature between about 500° C. and 1000° C.

Figure 2:
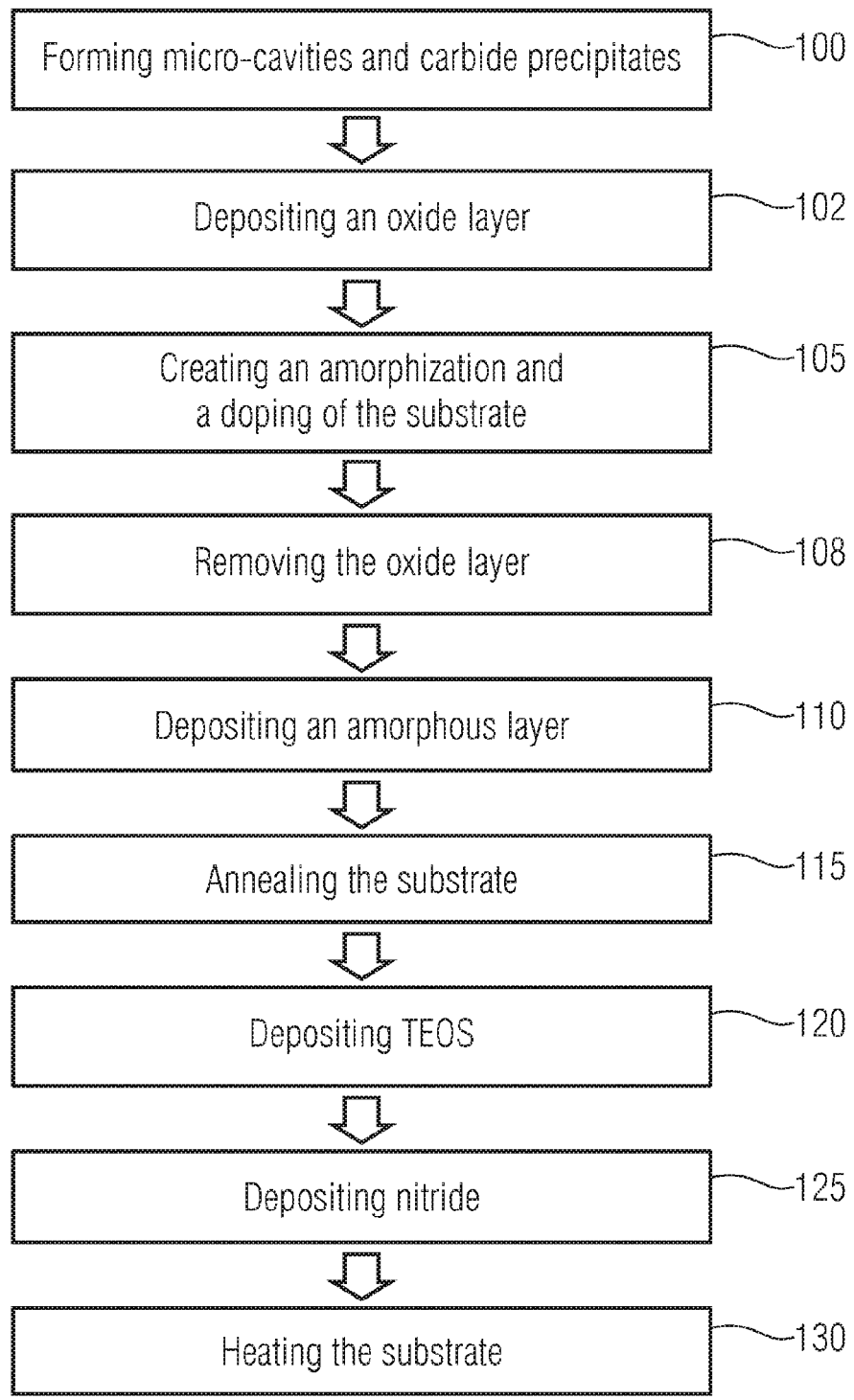
FIG. 2 shows a flow chart of another embodiment of a method of producing a semiconductor element in a substrate.

FIG. 2 shows another embodiment of the method of producing a semiconductor element in a substrate. The flow chart comprises further possible process steps in addition to those for the method of producing a semiconductor element in a substrate. After forming micro-cavities and carbide precipitates in a substrate (step 100) as explained above, an oxide layer (step 102) may be deposited on top of the substrate, which may act as a screen oxide in order to reach a certain scattering of the atoms in a subsequent implantation steps and, therefore, a reduction of the so-called channeling process during implantation. Depositing a screen oxide layer may already take place before forming the micro-cavities and the carbide precipitates in the substrate. By using, for example, a 10 nm thick screen oxide, an $H_2^+$-ion implantation for forming the micro-cavities with an implantation energy of E=10 keV and an implantation dose $\phi=10^{16}$ cm$^{-2}$ can reach a depth of approximately 100 nm.

In accordance with another embodiment of the invention, the oxide layer could also act as an additional mask in order to limit the lateral extension of the micro-cavity and carbide precipitate region and/or the amorphization/doping zone in the substrate. It is also feasible that the creating of the amorphization and the doping of the substrate (step 105) is done first and may be followed by forming a plurality of micro-cavities and carbide precipitates in the substrate. After creating an amorphization and a doping of the substrate (step 105), the above-mentioned deposited oxide layer or mask can be removed (step 108), if applicable by conventional means.

It is feasible that an amorphous layer can be deposited (step 110) on top of the substrate with the aim to protect the doping atom concentration close to the surface of the semiconductor element. As described above, annealing, heating the substrate or, in other words, a thermal treatment (step 115) of the substrate being amorphized before, is carried out in order to enable a re-crystallization by a solid-phase epitaxial regrowth (SPER). Thereby, the end of range defects or interstitials can be reduced or eliminated by the implanted micro-cavity and the formed carbide precipitates. Annealing the substrate may be performed such that the amorphous layer, being deposited before (step 110), is also re-crystallized. Producing a semiconductor element may comprise further process steps, for example, depositing tetra-ethyl-ortho-silicate (TEOS) (step 120) and depositing nitride (step 125), for example, for a nitride spacer construction. Moreover, the production of a semiconductor element may comprise further heating processes of the substrate (step 130), for example, a rapid thermal process (RTP), a laser annealing or flash annealing or a low temperature silicidation. That means for producing a semiconductor element or a semiconductor device a plurality of heating processes may be still necessary. For example, a high temperature (1200° C.<T<1350° C.) laser or flash annealing step may be integrated in the process of record for fabricating the semiconductor device. For simplicity, in the flow chart of FIG. 2 only one heating step 130 is depicted exemplarily.

Figure 3:
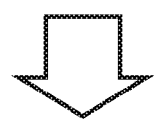
FIG. 3 shows a flow chart of a method of producing a semiconductor element in a substrate by forming at least two bands of a plurality of either micro-cavities or carbide precipitates in the substrate.
Figure 3:
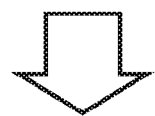

FIG. 3 shows a flow chart of a method of producing a semiconductor element in a substrate, which comprises forming at least two bands of a plurality of one of micro-cavities and carbide precipitates spaced at a certain distance from each other in the substrate (step 101).

The method further comprises a creating and amorphization of the substrate to form crystallographic defects and a doping of the substrate with doping atoms (step 105). Moreover, annealing the substrate, such that at least a part of the crystallographic defects is eliminated using the micro-cavities and the carbide precipitates (step 115). Thereby, the semiconductor element is formed using the doping atoms.

The method of producing a semiconductor element in a substrate can be performed in such a way, that at least two bands of a plurality of micro-cavities are formed as it is described in the context to the FIG. 1 and will be described later in context to the FIG. 12. Both bands of micro-cavities may be spaced from about 0 nm to about 120 nm, preferably about 70 nm to about 120 nm, for example, about 80 nm. The at least two bands may be also formed by carbide precipitates, as described in context to FIG. 1 and in context to FIG. 11. The carbide precipitates may be formed by implantation of carbon ions into the substrate, wherein the energy and also the dose for the implantation may be varied in order to form at least two bands of carbide precipitates placed at a certain distance of each other. The distance between the two bands of carbide precipitates and the substrate may be varied between about 0 nm to about 120 nm, preferably about 70 nm to about 120 nm, for example, about 80 nm.

The creation of both amorphization and doping of the substrate (step 105) may be performed as described above. That means creating an amorphization of the substrate to form crystallographic defects and a doping of the substrate with doping atoms can comprise the use of amorphization ions for pre-amorphization of the substrate followed, for example, by low energy p-type dopant implantation. The amorphization of the substrate and the doping of the substrate may comprise implanting boron atoms, phosphorus atoms or arsenic atoms in the substrate. The implanting of boron atoms may comprise the introduction of boron ions into the substrate, introducing boron fluoride ($BF_2$) or introducing boron clusters ($B_xH_y$). The amorphization can be done either by using amorphization ions for pre-amorphization of the substrate followed by a doping with doping atoms or by a doping of the substrate with doping atoms, which, apart from the doping, can also cause an amorphization of the substrate. By means of implanting the amorphization ions, for example, germanium ions or silicon ions in the crystalline region of the substrate, crystallographic defects will be generated. So-called interstitials may be formed close to the interface between the amorphous region and the crystalline region of the substrate, which may cause a deactivation of doping atoms and can give rise to the transient enhanced diffusion in the substrate.

The annealing of the substrate may be again performed within the scope of a SPER process in order to re-crystallize at least a part of the amorphized region of the substrate. The annealing, or the thermal treatment of the substrate, may be performed for example, at a temperature lower than about 650° C. or lower than about 580° C. The end of range defects, the interstitials respectively, may be reduced or eliminated effectively by the forming of at least two bands of micro-cavities or carbide precipitates in the substrate during the annealing process.

Figure 4:
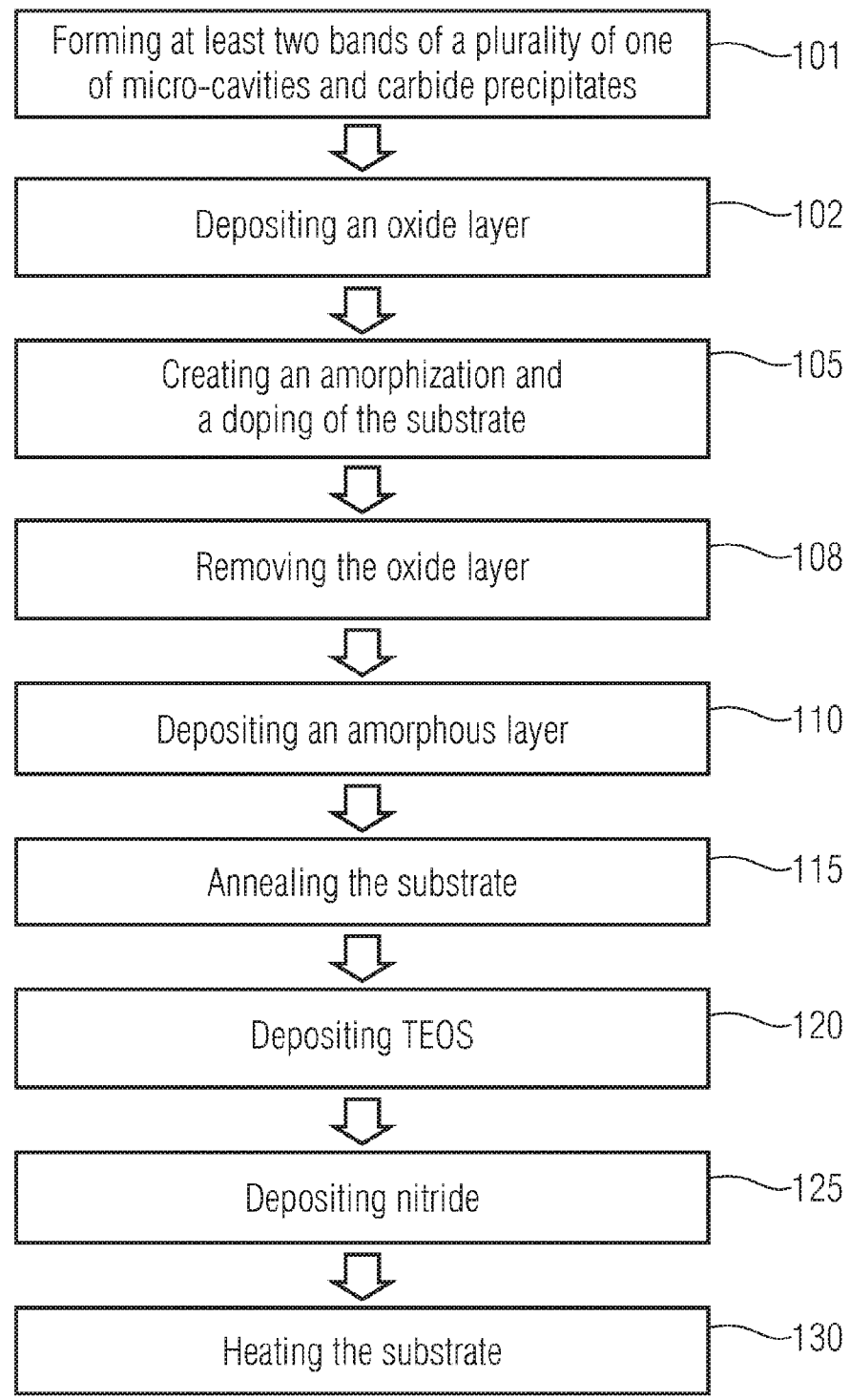
FIG. 4 shows a flow chart of another embodiment of a method of producing semiconductor elements in a substrate.

FIG. 4 shows that the method may comprise further possible process steps for producing a semiconductor element in a substrate. After forming the at least two bands of a plurality of one of micro-cavities and carbide precipitates in a substrate (step 101) as explained above, an oxide layer (step 102) may be deposited on top of the substrate, which may act as a screen oxide in order to reach a certain scattering of the atoms in subsequent implantation steps and, therefore, a reduction of the channeling, which may occur during the implantation process. As described above, depositing a screen oxide layer may be take place before forming the at least two bands of micro-cavities or carbide precipitates in the substrate. In accordance with another embodiment of the invention, the oxide layer could also act as an additional mask in order to limit the lateral extension of the at least two bands of micro-cavity or a carbide precipitates region and/or the amorphization/doping zone in the substrate. The following steps 108 to 130, depicted in the flow chart of FIG. 4 may be performed as already described in context to FIG. 2. That means after creating an amorphization and a doping of the substrate, the oxide layer may be removed, in case it was deposited before. Furthermore, an amorphized layer, for example, silicon oxide, may be deposited (step 110) on top of the substrate and afterwards the above described annealing, respectively the thermal treatment of the substrate (step 115) may be performed. Furthermore, producing a semiconductor element in a substrate may comprise depositing a TEOS layer (step 120), depositing nitride (step 125) or a nitride spacer construction or may comprise further heating processes of the substrate (step 130), for example, a RTP process, a laser annealing, a flash annealing or a low temperature silicidation.

Figure 5:
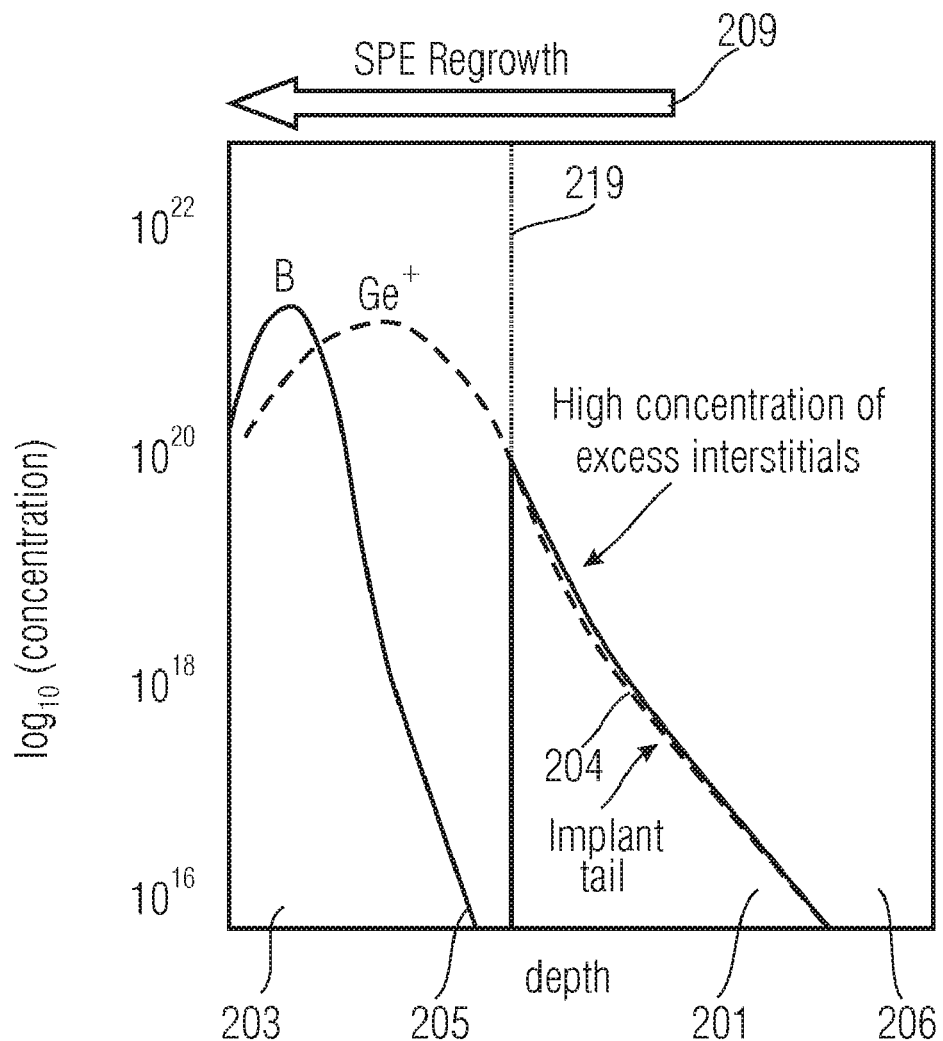
FIG. 5 shows a schematic diagram illustrating a conventional pre-amorphization of a substrate, with germanium (Ge$^+$)-ions, a boron (B) doping concentration profile, excess interstitials and the direction of a solid-phase epitaxial regrowth (SPER)

FIG. 5 shows the concentration of boron and germanium in an logarithmic representation in a silicon substrate. The ion concentration is plotted along the ordinate of the diagram and the ion concentration depending on the depth into the substrate is plotted along the abscissa of the diagram. The main processing surface of the substrate is on the left hand side (the ordinate) of the diagram.

Figure 6:
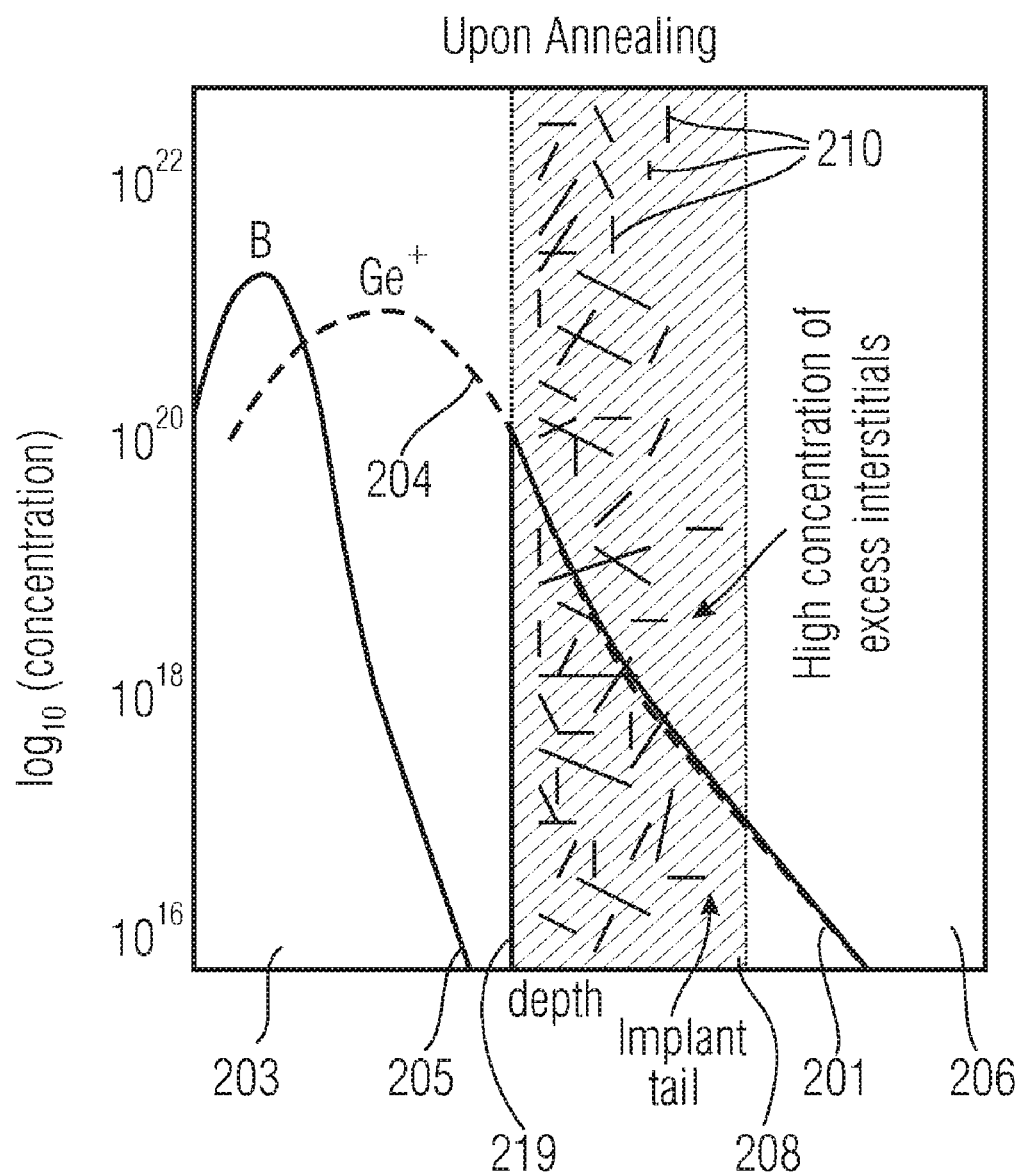
FIG. 6 shows a schematic diagram illustrating the interstitials upon annealing.

It is assumed that the surface region 203 of the substrate has been pre-amorphized using germanium ions as implantation ions with a concentration profile as depicted in the diagram by a curve 204. It is furthermore assumed that after the pre-amorphization has been carried out, boron atoms were implanted into the substrate, for example, by means of introducing boron ions or introducing boron fluoride ions into the substrate. The respective concentration profile of the boron atoms is represented by curve 205. As it is shown in FIG. 5, the $Ge^+$-ion implantation in the substrate has been carried out in such a way that after the implantation, both amorphized regions 203 and the crystalline left region 206 of the substrate contain germanium. During the implantation of the $Ge^+$-ions into the crystalline region 206 of the substrate, crystallographic damages, also termed crystallographic defects or interstitials are created. Such interstitial type defects or interstitials are formed within the crystalline region 206 of the substrate as result of the implantation of germanium ions. The interface 219 is separating the amorphous region 203 and the crystalline region 206, which comprises a high concentration of excess interstitials. A subsequent annealing process for example at a temperature lower than about 650° C. or lower than about 580° C., is carried out in order to enable a re-crystallization of a portion of the amorphized region 203 during a solid phase epitaxial regrowth (SPER) process as indicated by the arrow 209 in FIG. 5. But it is also feasible to perform the annealing at a temperature of about 500° C. to about 1000° C. Some of the interstitials formed by the implanted doping are eliminated. However, not all of them are eliminated. Particularly, in a border region 208 (see FIG. 6) at the interface 219 between the amorphous region 203 and the crystalline region 206, so-called end of range interstitial type defects 210 remain. In other words, even after the SPER step, end of range interstitial damages still remain in the tail of the implant profile 201 (see FIG. 5). FIG. 6 depicts a situation upon annealing the substrate. Upon annealing, the interstitials are condensed into interstitial type defect 210, also termed EOR which may drive transient enhanced diffusion and the deactivation of the doping atoms.

The interstitial type defects 210 may cause transient enhanced diffusion of doping atoms, for example, boron atoms in FIG. 6, and furthermore they are the cause for a non desirable deactivation of the doping atoms. Both the deactivation of the doping atoms and the TED are consequences of one of the same mechanism, namely the super saturation of point defects created by the implantation process. During the following solid-phase epitaxial regrowth, the crystallization process eliminates usually a part of the interstitials, but not all of them are annealed. In particular the end of range defects will remain at the border between the amorphous region 203 and the crystalline region 206. Furthermore, it has to be noted that the interstitial type defects 210 partly diffuse in the direction towards the main surface of the substrate (in FIG. 6, to the left hand side).

As a substrate, the silicon substrate can be used, for example, a (100)-silicon substrate or a (111)-silicon substrate.

Figure 7A:
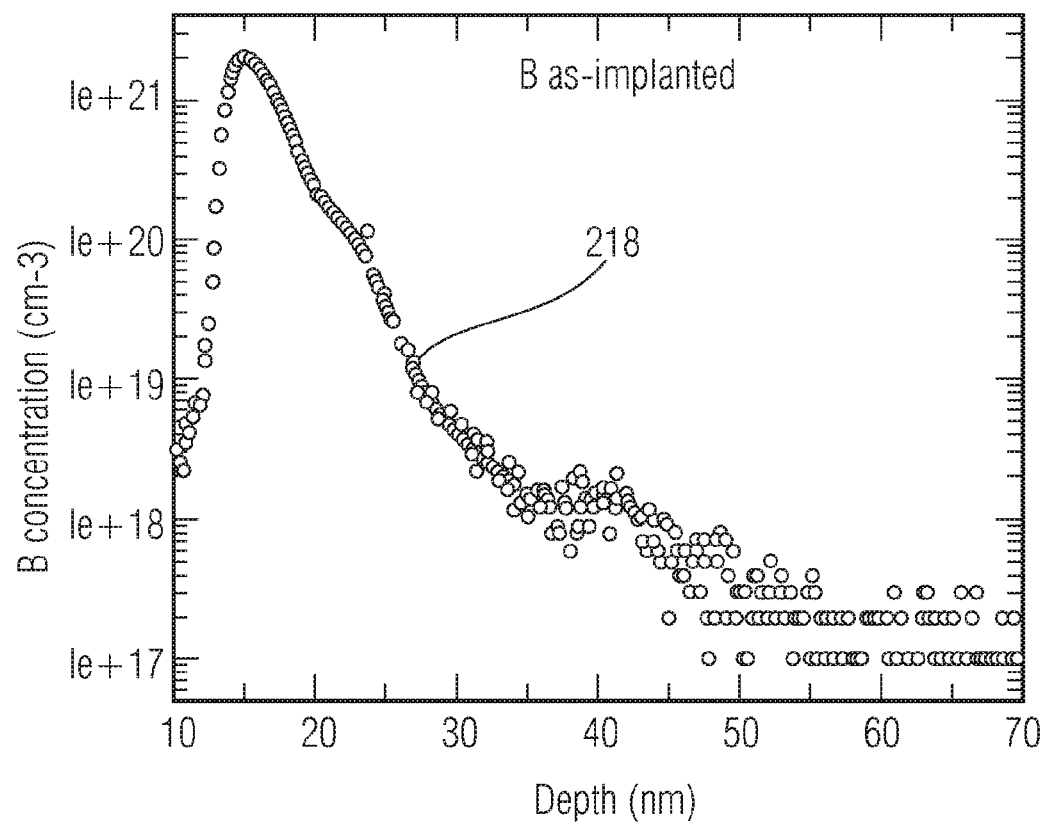
FIGS. 7a-7d show the measured boron doping profiles in a pre-amorphized silicon substrate for different annealing temperatures.
Figure 7B:
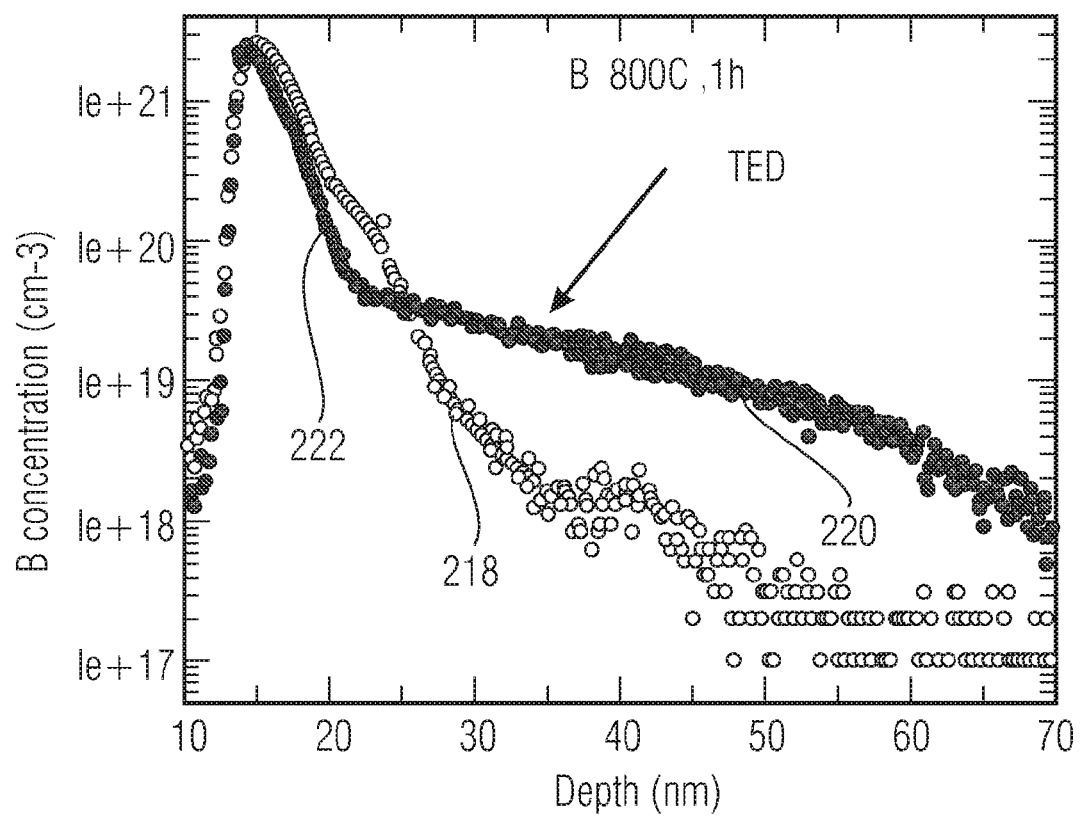

FIGS. 7a to 7d show a measured secondary ion mass spectrometry (SIMS) boron doping profile in a silicon substrate depending on the depths in the substrate for different annealing temperatures. The depicted boron doping concentration profiles may be typical curves, as they are formed for producing ultra shallow junctions in certain semiconductor elements. That means the depicted concentration values as well as the values for the depths of the boron concentration may be typical values. FIG. 7a shows the boron doping concentration 218 as-implanted. For the further processing of the semiconductor element, it would be desirable that the doping profile would not change and would remain as implanted. As it is shown in FIG. 7b the doping profile within the substrate changes by applying a temperature of about 800° C. for 1 hour (curve 220) for the subsequent annealing process in order to perform the re-crystallization of the amorphous part of the substrate. The mechanism, which leads to the depicted change of the boron doping profile, is the so-called transient enhanced diffusion. The transient enhanced diffusion (TED) of the implanted doping atoms, in this case, boron, is normally caused by crystallographic defects, interstitials respectively. Compared to the as-implanted curve 218, curve 220 comprises another characteristic feature 222, which is caused by the so-called uphill diffusion of the doping atoms.

Figure 7C:
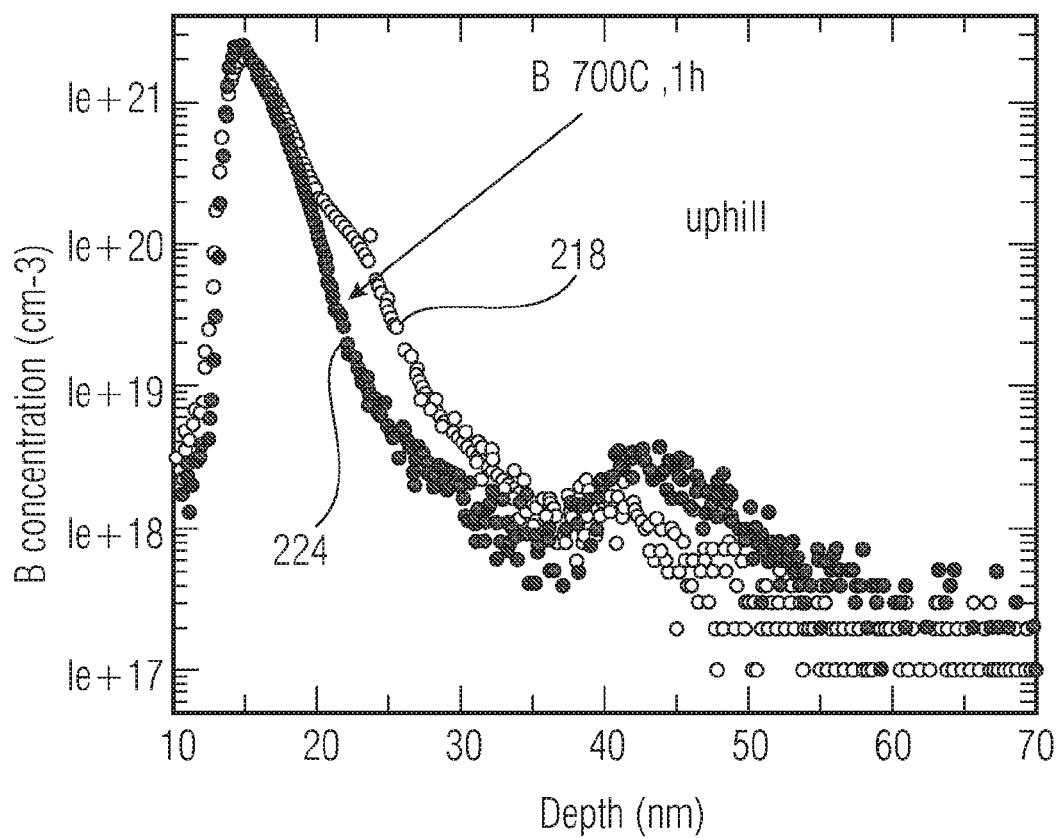

In contrast to the TED, the uphill diffusion can already be seen at an annealing temperature of about 700° C., which is applied for 1 hour (see FIG. 7c). The uphill diffusion leads to a shift of the boron doping concentration towards the direction of the substrate surface, as can be seen by comparing curve 218, which shows the boron doping concentration as-implanted with curve 224 after uphill diffusion of the boron atoms. The specific term "up-hill" diffusion is here referred to describe the un-typical phenomena of dopants diffusing against their gradient of concentration.

Figure 7D:
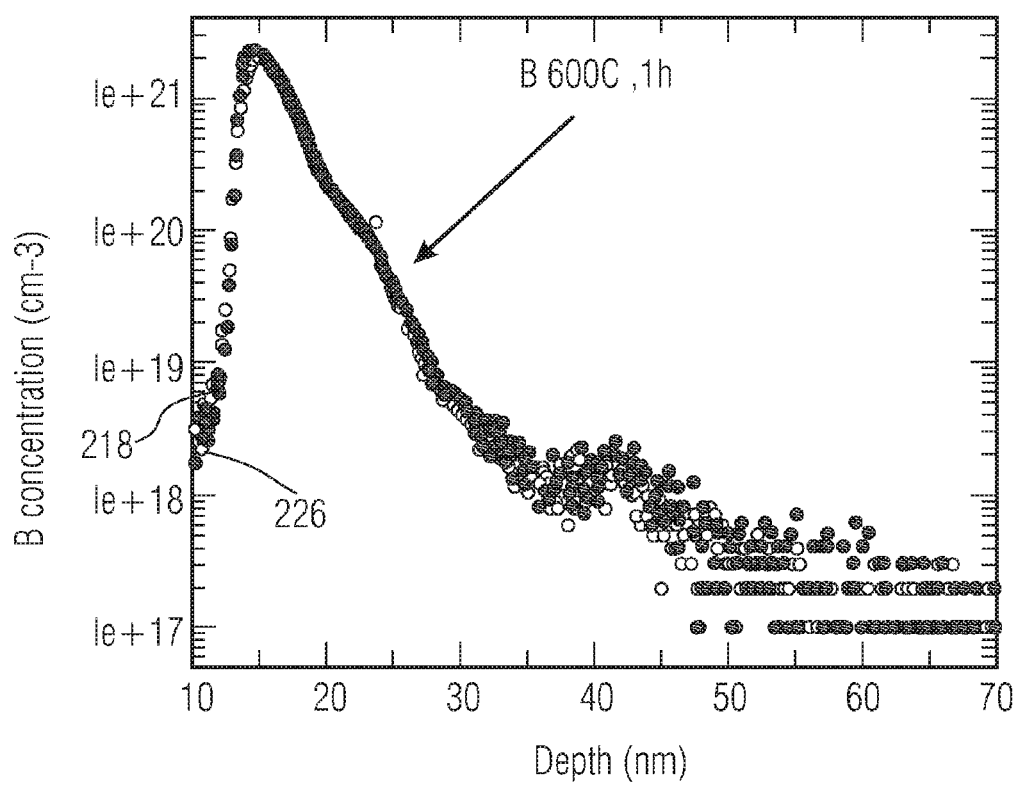

In FIG. 7d it is shown, that an optimized thermal SPER process at about 600° C. for 1 hour leads to no change in the boron doping profile curve. The boron as implanted curve 218 and the curve 226 after annealing at about 600° C. for 1 hour are almost identical.

Figure 8A:
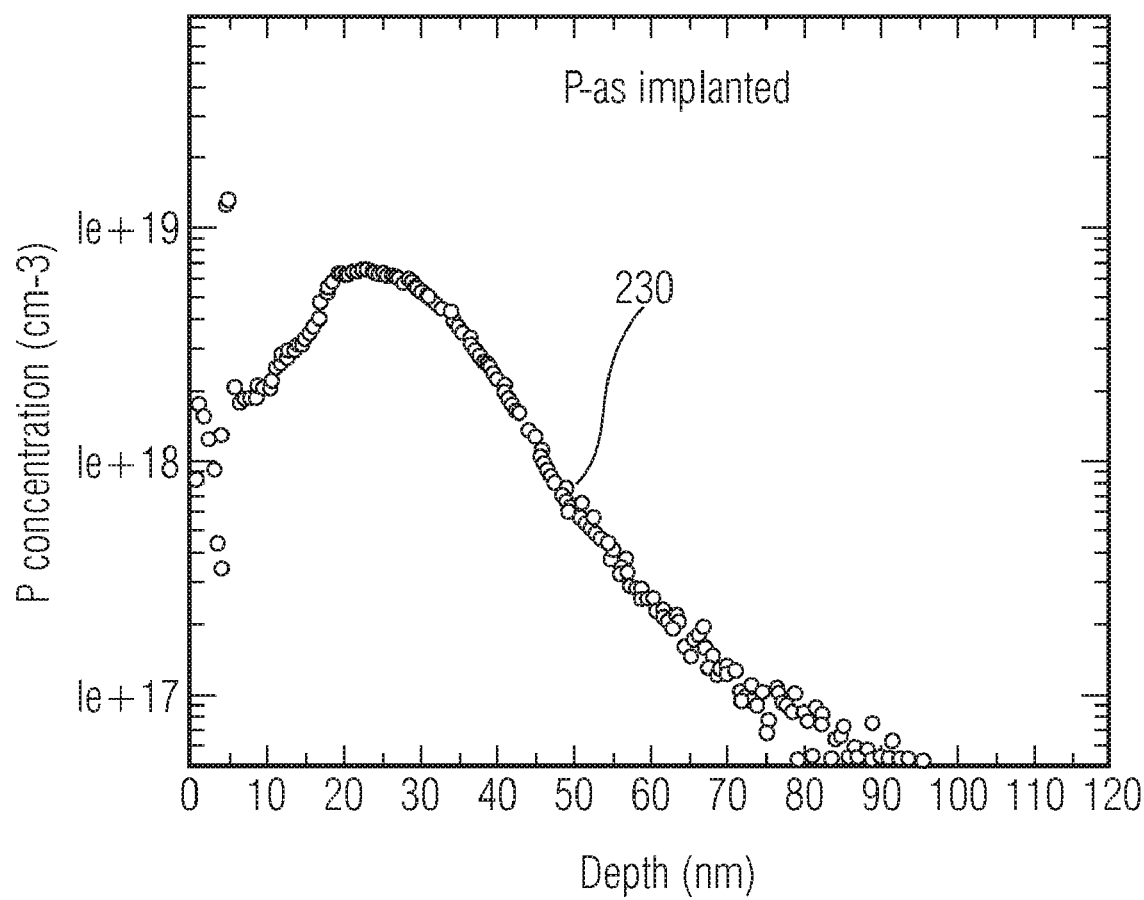
FIGS. 8a-8d show the measured phosphorus doping profiles in a pre-amorphized silicon substrate for different annealing temperatures.

As mentioned above, the doping of the substrate with doping atoms is not only restricted to p-type boron atoms, but can also be performed by n-type dopants such as phosphorus atoms. Accordingly FIGS. 8a to 8d show measured phosphorus doping profiles depending on the depths of the substrate for different annealing temperatures. FIG. 8a shows the phosphorus doping profile 230 as-implanted depending on the depths in the substrate. The depicted concentrations values in the depth of the substrate may be typical values for semiconductor elements with shallow or ultra shallow junctions.

Figure 8B:
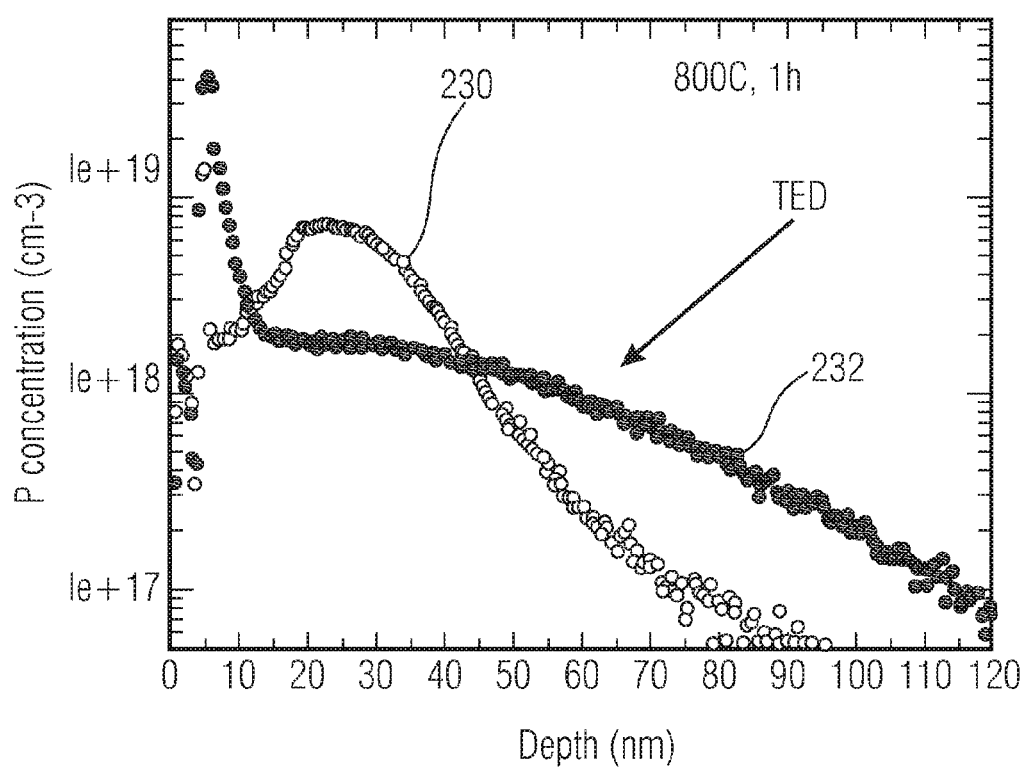

FIG. 8b shows the doping profile curve 230 for the phosphorus dopant as-implanted. Compared to the doping profile 232 after annealing the substrate for 1 hour at about 800° C. The doping profile curve 232 after annealing comprises again a significant change compared to the curve 230, caused by the uphill diffusion and the TED.

Figure 8C:
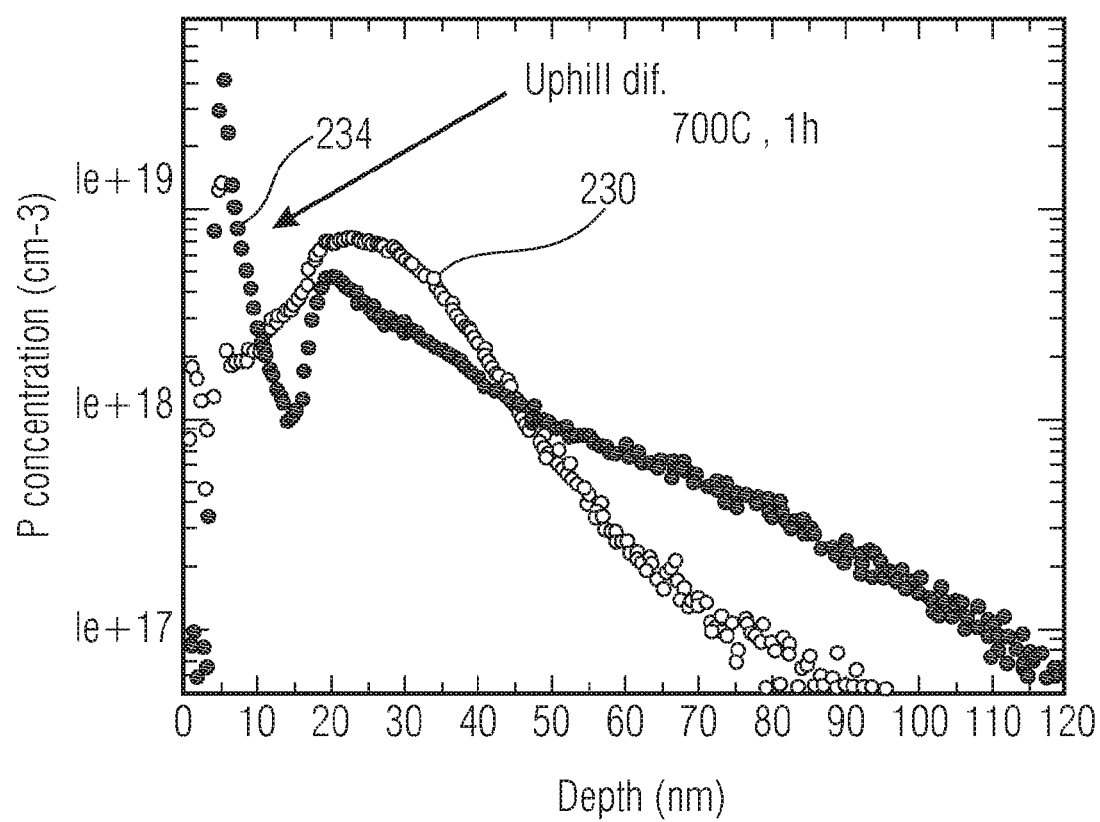

An annealing for 1 hour at about 700° C. may give rise to a distinct uphill diffusion, as it can be seen in FIG. 8c in a comparison of curve 234 with 230.

Figure 8D:
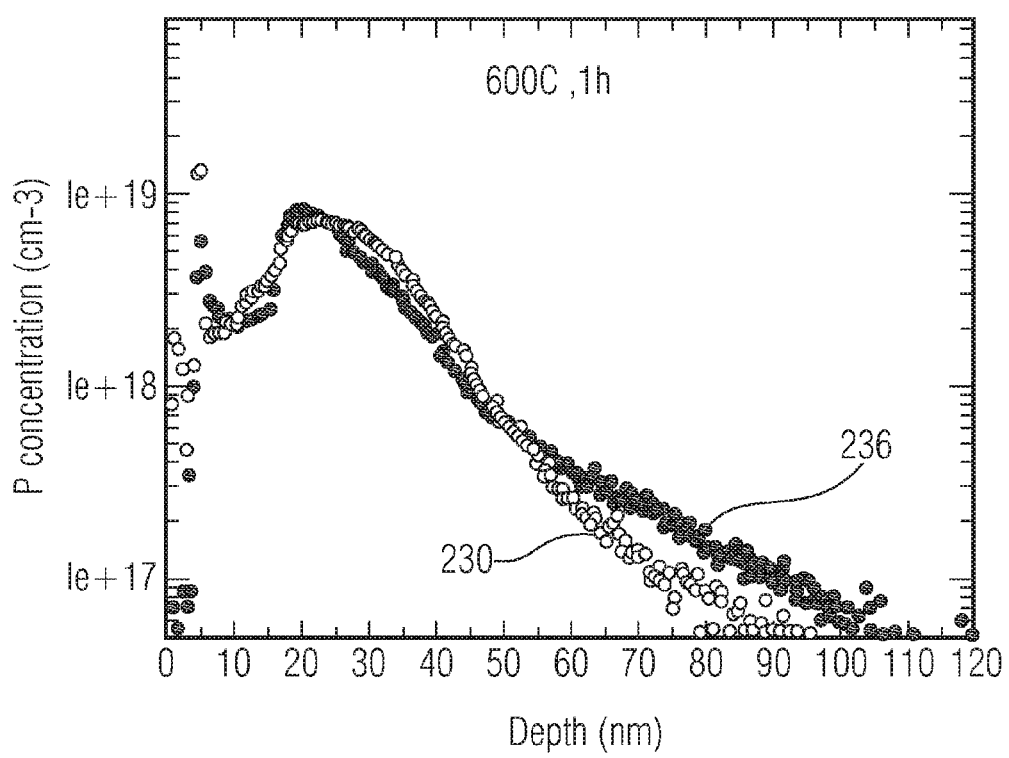

FIG. 8d depicts clearly, that an annealing of the substrate at about 600° C. for 1 hour does not lead to any significant change in the phosphorus doping profile as-implanted curve 230 the curve 236 (after 1 h at 600° C.). The exact diffusion behavior of the respective doping atoms depends on the respective chemical and physical properties of the doping atoms. The doping of the substrate can be performed with different kind of doping atoms.

In order to anneal the implantation damage caused by the amorphization implantation and/or by the doping implantation and in order to activate the doping atoms, normally a high temperature step at an annealing temperature ranging from about 1100° C. up to about 1350° C. is often applied. This may be done by a rapid thermal annealing which can comprise laser heating or flash heating. One disadvantage of this method is the deactivation of the doping atoms during a subsequent low temperature annealing process. The deactivation of the doping atoms at low temperature occurs on account of the formation of immobile doping atom interstitial clusters. The source of interstitials, which are needed for the formation of the doping atom interstitial clusters, are the above-mentioned end of range defects.

Figure 9:
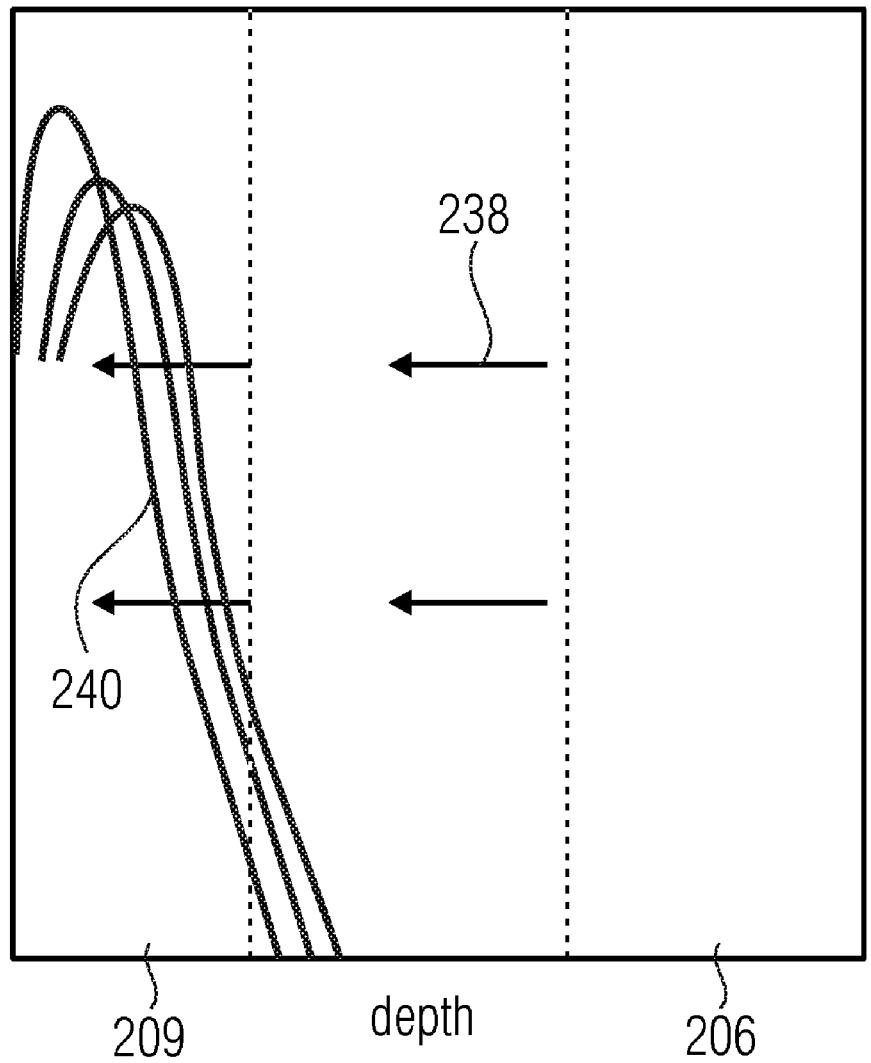
FIG. 9 shows in a diagram the conventional understanding of uphill diffusion in a substrate.

FIG. 9 shows a diagram of the previous understanding of uphill diffusion. The previous understanding, for example, for boron atoms in silicon, was based on the assumption that during a solid-phase epitaxial regrowth annealing, boron is pushed out of the substrate by the moving front of re-crystallization. The moving front of the solid-phase epitaxial regrowth is depicted schematically in FIG. 9 by arrows 238 and the respective shift of the boron doping profile curve 240 in the direction towards the silicon substrate surface (on the left hand side in FIG. 9).

Figure 10:
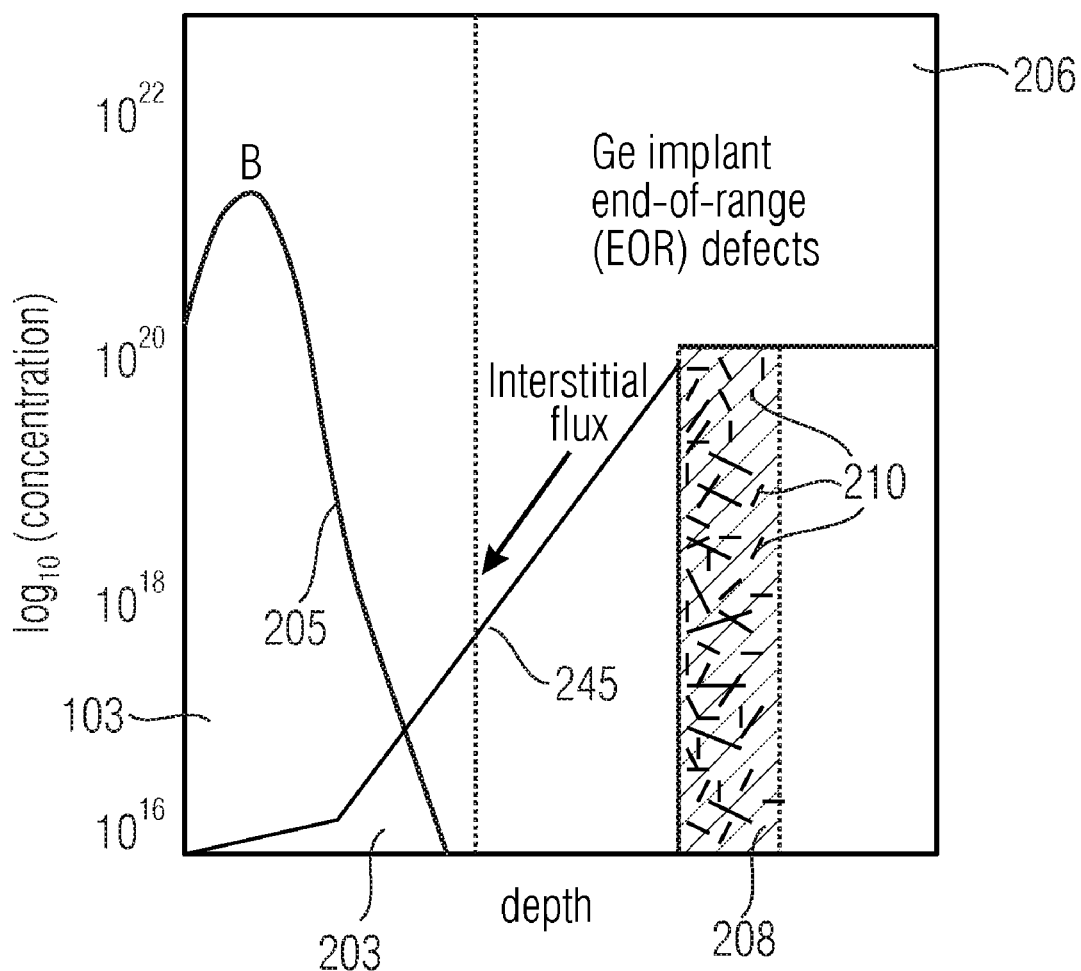
FIG. 10 shows a diagram with an interstitial flux according to the new understanding of uphill diffusion in a substrate.

FIG. 10 shows a diagram of the new physical understanding of uphill diffusion, which is based on the finding that interstitials 210 emitted from the end of range defect band 208 are the source of the uphill diffusion. The interstitial type defects 210 partially diffuse in the direction toward the surface of the silicon substrate and, therefore, in the direction towards the amorphous region 203. This interstitial type defect diffusion is depicted in FIG. 10 as interstitial flux 245. That means an effective elimination of the interstitials at the interface between the amorphous region and the crystalline region of the substrate can prevent the undesirable transient enhanced diffusion, the dopant deactivation as well as the uphill diffusion.

Figure 11:
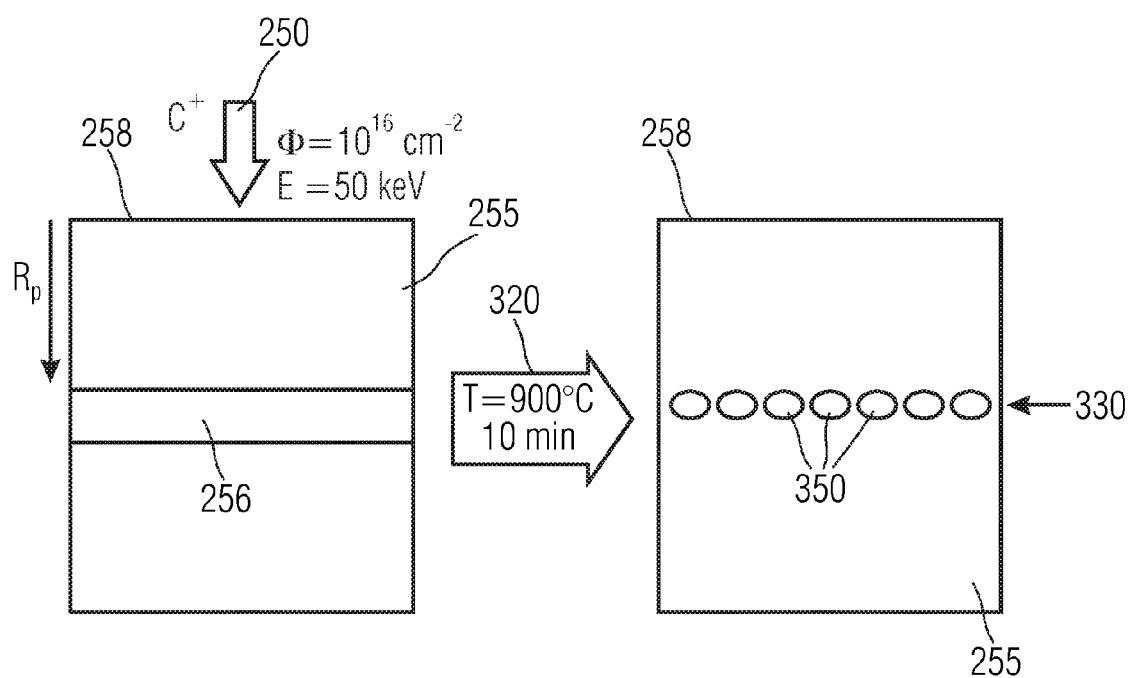
FIG. 11 shows a possibility to form silicon carbide precipitates to a band of silicon carbide precipitates within a substrate.

FIG. 11 gives an exemplary overview, how silicon carbide precipitates or a band of silicon carbide precipitates are formed in a silicon substrate. Silicon carbide precipitates 350 may be formed from carbon atoms 256 implanted into a silicon substrate 255. At low concentrations, carbon atoms are incorporated substitutionally into the crystal lattice of a silicon substrate. Since the atomic radius of carbon is considerably smaller than the atomic radius of silicon (0.77 Angström compared to 1.17 Angström), the crystal lattice will be locally perturbed or distorted (that is, in the vicinity of the substitutional carbon atom). The solid solubility $C_S$ of carbon in silicon has been measured experimentally by infrared spectroscopy to be approximately:

$$C_S = 3.9 \times 10^{24} \exp(-2.3 \text{ eV}/(k_b T)) \text{cm}^{-3}$$

wherein T denotes the temperature in Kelvin, $k_b$ is Boltzmann's constant and e is the electron charge.

According to this equation for a temperature of about 900° C., the solubility of carbon in silicon is on the order of $10^{15}$ cm$^{-3}$. In other words, approximately $10^{15}$ carbon atoms per cubic centimeter may be substitutionally incorporated into the silicon crystal lattice at this temperature.

Above the solubility limit $C_s$, carbon precipitates mainly into a SiC phase. The main prerequisites for SiC precipitation are a high carbon concentration and a high interstitial concentration.

Due to the smaller atomic radius of carbon, compared with that of silicon, precipitation of SiC involves the contraction of the structure by a factor of two. In other words, a local volume reduction by a factor of two results from the SiC precipitate formation. This volume change may be accommodated either elastically, i.e., by an elastic deformation of the lattice structure or by the capture and emission of point defects.

Contrary to the conventional cocktail implant approach, the carbon ions may be implanted prior to the germanium pre-amorphization step with a very high dose, for example, approximately $10^{16}$ cm$^{-2}$ and a relatively high energy, for example, approximately 15 keV. The silicon substrate may be, for example, a silicon (100)-substrate or a silicon (111)-substrate. By means of the implanted carbon ions 250, a high density or concentration of carbon atoms 256 may be formed at a pre-determinable depth within the silicon substrate 255 below the substrate surface 258. The concentration maximum of the implantation profile is located at a projected range Rp. In other words, the implanted carbon atoms 256 are distributed within the silicon substrate 255 around the concentration maximum the so-called "projected range Rp". Rp insures the implantation depths of the carbon ions 250 can be tuned or, in other words, modified by changing, for example, the parameters implantation dose (φ) and energy (E). The parameters φ and E can be chosen in such a way, that silicon carbide precipitates, which will be formed in a later process step, are formed below a channel region 365 (FIG. 19) of a semiconductor device, for example, a transistor.

According to another embodiment the projected range Rp could be defined as a mean value of the distribution of the respective carbon implantation. These definitions apply for carbide precipitates, a band of carbide precipitates as well as for micro cavities and a band of micro cavities.

By means of a high dose carbon implant, both a high concentration of carbon atoms and a high concentration of interstitial can be formed within the silicon substrate. By means of the high concentration of both carbon atoms and self-interstitials, silicon carbide (SiC) precipitation can be initiated in the silicon substrate.

As it is shown in FIG. 11, an annealing step 320 may be carried out with a low thermal budget at an annealing temperature of T=900° C. and an annealing time duration of, for example, 10 minutes.

By means of the thermal treatment 320, a network or band 330 of SiC precipitates 350 may be formed within the substrate 255 at a depth which corresponds to the projected range Rp. The precipitate band 330 includes a plurality of separated or isolated, in other words, non-connected, silicon carbide precipitates 350, wherein the silicon carbide precipitate band 330 or the silicon carbide precipitate layer 330 is oriented roughly in parallel to the substrate surface 258.

Clearly, a band 330 of silicon carbide precipitates 350 is formed at the implanted projected range Rp, wherein by means of the thermal treatment 320, the implanted damage resulting from the implantation of carbon ions 250 may be fully annealed and the silicon carbide nucleation process can be enhanced.

The temperature values T and the time duration of the annealing step shown in FIG. 11 serve only as an example and can be tuned or optimized in such a way that, for example, the density or concentration and/or the size of the silicon carbide precipitates 350 do not exceed pre-determinable threshold values, such that, for example, a delamination of the substrate 255 can be avoided.

The carbon ions may be implanted at an implantation dose of approximately between $10^{14}$ cm$^{-2}$ and $10^{18}$ cm$^{-2}$, for example, with an implantation dose of approximately $10^{16}$ cm$^{-2}$. The carbon ions may be implanted in such a way that they have an energy of approximately between 10 keV and 100 keV during implantation, for example, approximately 50 keV. The substrate with the implanted carbon ions may be subjected to a thermal treatment, in other words, a tempering or annealing step, such that the carbide precipitate are formed. The thermal treatment may be carried out using a low thermal budget. The substrate may be heated to a temperature of approximately between about 600° C. to about 1000° C., for example about 900° C., during the thermal treatment. The duration of the thermal treatment may be approximately between about 5 minutes and about 4 hours, for example, about 10 minutes. At least one of the plurality of carbide precipitates may have a length of approximately between about 4 nm and about 120 nm, for example, 10 nm, a width of approximately between about 4 nm and about 120 nm, for example about 10 nm and a height of approximately between about 4 nm and about 120 nm, for example, about 10 nm. Furthermore, one of the carbide precipitates may be approximately spherical in shape having, for example, a radius between approximately about 2 nm and about 60 nm. The band of the silicon carbide precipitates or, in general, the carbide precipitates may have a thickness, in other words, an extend in the direction of the surface normal of approximately between about 20 nm and about 200 nm, for example about 100 nm. The precipitates in the band structure may have, for example, a size of approximately about 10 nm.

FIG. 12 shows exemplarily process steps to form micro-cavities in a silicon substrate 400. The micro-cavity may be formed by the implantation of light ions, for example, in this case, $H_2^+$-ions 410, in a silicon substrate 400. The implantation of the $H_2^+$-ions 410 may be performed exemplarily with the implantation dose $\phi = 10^{16}$ cm$^{-2}$ and an implantation energy of E=38 keV. By implanting the light ions 410, small micro-cavities or small micro-discs 420 are formed. The micro-discs 420 are distributed in a narrow band 430 with a concentration maximum, which is corresponding to the projected range Rp of the light ions 410. The projected range Rp and therefore the depth of the band 430 of micro-discs 420 may be changed by changing the parameter dose $\phi$ and the energy E of the implantation. As it is shown in FIG. 12, the micro-discs 420 are arranged roughly in parallel to the substrate surface 401. In the case of using an (100)-silicon substrate, the micro-discs 420 may be oriented along the (100) plane while the (111)-plane, wherein the length of the micro-discs 420 may be distributed.

As it is shown in FIG. 12, a thermal treatment or a heating process 440 may be applied to the substrate, which comprises the micro-discs 420. The thermal treatment 440 may be performed at a temperature of about 700° C. that means with a low thermal budget for time duration of 60 minutes. By heating the implanted $H_2^+$-ions the ions diffuse out forming hydrogen molecules and the micro-discs 420 forming a band of micro-cavities 450.

The values of the temperature T and the time duration of the annealing step shown in FIG. 12 serve only as example and can be tuned or optimized in such a way that, for example, the density or concentration and/or the size of the micro-cavities 450 do not exceed pre-determinable threshold values, such that, for example, a delamination of the substrate 400 can be avoided. By means of a further thermal treatment 460, for example, at a temperature of about 1100° C., the small micro-cavities 450 may be transformed into micro-cavities 470 arranged in a band or a network 445. The micro-cavities 470 are formed within the substrate 400 at a depth which corresponds to the projected range Rp of the micro-cavity band 445 which includes a plurality of separated or isolated micro-cavities, in other words, non-connected micro-cavities, wherein the micro-cavity band 445 is oriented roughly in parallel to the substrate surface 401. During the second thermal treatment 460, a conservative ripening process will take place in the substrate 400, wherein the many small micro-cavities 450 are transformed into larger micro-cavities 470. The size of the micro-cavities in the substrate can be tuned by the exact implantation and annealing conditions. In general, the length and the width of the micro-cavities may be in the order of, for example, about 10 nm and the height of the micro-cavities may be in the order of about 0.54 nm. It is also possible, for example, that the micro-cavities comprise a width of about 5 nm to about 100 nm or even several hundred nanometers as well as a length of about 20 nm to about 100 nm or several hundred nanometers and a height of about 10 nm to about 100 nm or several hundred nanometers, for example, approximately about 50 nm. By means of the implantation dose and/or the implantation energy, the depth and the extension of the region in which the micro-cavities are formed in the substrate can be influenced. For example, the ions can be implanted with an energy between 10 keV and 150 keV and with an implantation dose of approximately $10^{15}$ cm$^{-2}$ and $10^{18}$ cm$^{-2}$. Besides the implantation dose, the energy and the thermal treatment and the temperature of the thermal treatment can be tuned in order to optimize the density and the size of the micro-cavities. By the annealing of the substrate, the implanted light ions, for example, $H_2^+$-ions may diffuse out of the substrate as $H_2$ molecules.

Figure 13:
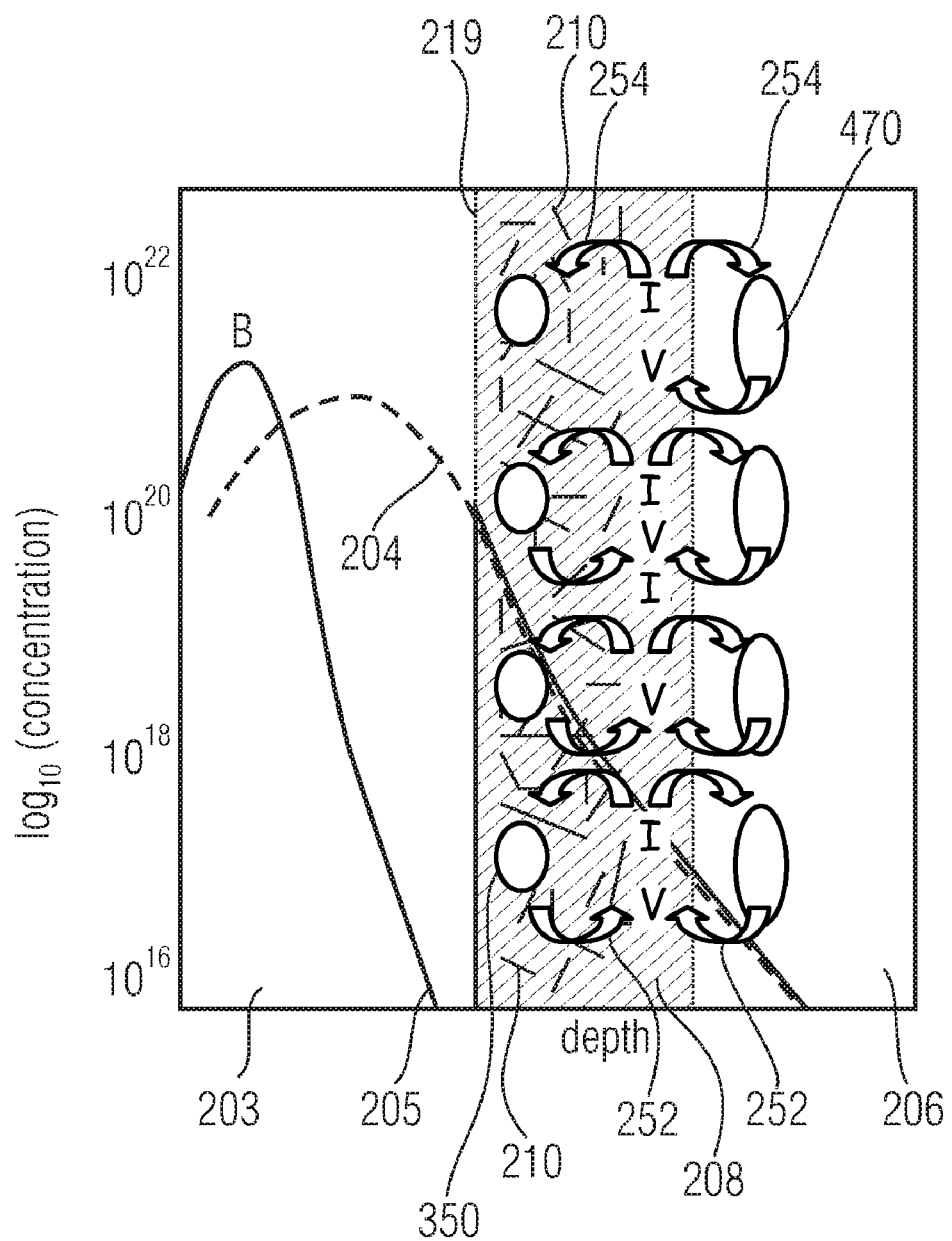
FIG. 13 shows a diagram depicting the elimination of interstitials by introduced micro-cavities and silicon carbide precipitates beyond the amorphous/crystalline interface according to an embodiment of the invention.

According to an embodiment of the invention, FIG. 13 shows an overall view of the boron doping profile 205, the germanium profile produced by the pre-amorphizing implant 204, the amorphous silicon region 203, the crystalline silicon region 206, the end of range defect zone with a high concentration of excess interstitials 208, the interstitials 210, the SiC precipitates 350 and the micro-cavities 470. As it is shown in FIG. 13, the micro-cavities 470 may be formed within local proximity to the interstitials 210 or rather the end of the defect zone 208 to be expected and being formed later, wherein the micro-cavities 470 may be formed so close to the later formed interstitial 210 or rather the end of range defect zone 208 so as to serve as sinks for the interstitial 210. The micro-cavities 470 may be formed in the crystalline substrate region 206. The SiC precipitates may be formed as well in the crystalline region beyond the amorphous/crystalline interface 219 that means, in the end of range defect zone 208 to be expected and being formed later, wherein the SiC precipitates serve as sinks for the interstitials 210. In other words, the interstitial type defects 210 are dissolved by means of the micro-cavities 470 and the SiC precipitates 350. This process is symbolized by arrows 252 and 254. The micro-cavities 470 and the SiC precipitates 350 form a source of vacancies, depicted by the arrow 252, and serve as sinks for the interstitials, which are represented by the arrows 254. The elimination process of the interstitials 210 with both, the micro-cavities 470 and the SiC precipitates 350 can be very effective and can be carried out as a temperature supported process using a rapid thermal annealing (RTA). So, a very simple standard mechanism can be used for eliminating the undesired interstitial type defects 210. The micro-cavities 470 form a kind of artificial surface region within the substrate. The surface region of a substrate, which is known, acts as a sink for interstitials. The interstitial type defects 210 created by the cocktail implants (i.e., Ge+, B), maintains a high super-saturation of interstitials underneath the surface of a substrate. This interstitial super-saturation is heavily reduced by the presence of micro-cavities which act as effective sinks for interstitials. As mentioned above, the formation of the silicon carbide precipitates 350 results in a local volume reduction of the substrate. This volume reduction may then be accommodated either by elastic deformation or by the capture and emission of point effects. In other words, the silicon carbide precipitates 350 may release vacancies (V) and may serve as sinks for interstitial type point defects or interstitials 210 (I). The silicon carbide precipitates 350 may be formed within local proximity of the interstitial type effects 210 to be expected in being formed later. Wherein the silicon carbide precipitates 350 are formed so close to the later formed interstitials 210 that they serve as a sink for the interstitials 210.

As it is shown in FIG. 13, a plurality of micro-cavities 470 and SiC precipitates 350 may be located at a certain projected range Rp. The distance between the Rp of the SiC precipitates 350 and the Rp of the micro-cavities 470 can vary from about 0 nm to about 120 nm, for example, between about 70 nm and about 100 nm, for example, about 80 nm. The micro-cavities band should be located deeper in the substrate or at the same depth than the SiC precipitate band. Deeper means deeper relative to the main processing substrate surface. Both bands should be located in the crystalline region beyond the amorphous/crystalline interface 219, for example, the SiC precipitates can be located in the end of range defect zone (EOR) 208 and the micro-cavities beyond the EOR zone, but still within local proximity of the interstitials 210, or rather at the end of the defect zone 208 to be expected in being formed later.

Figure 14:
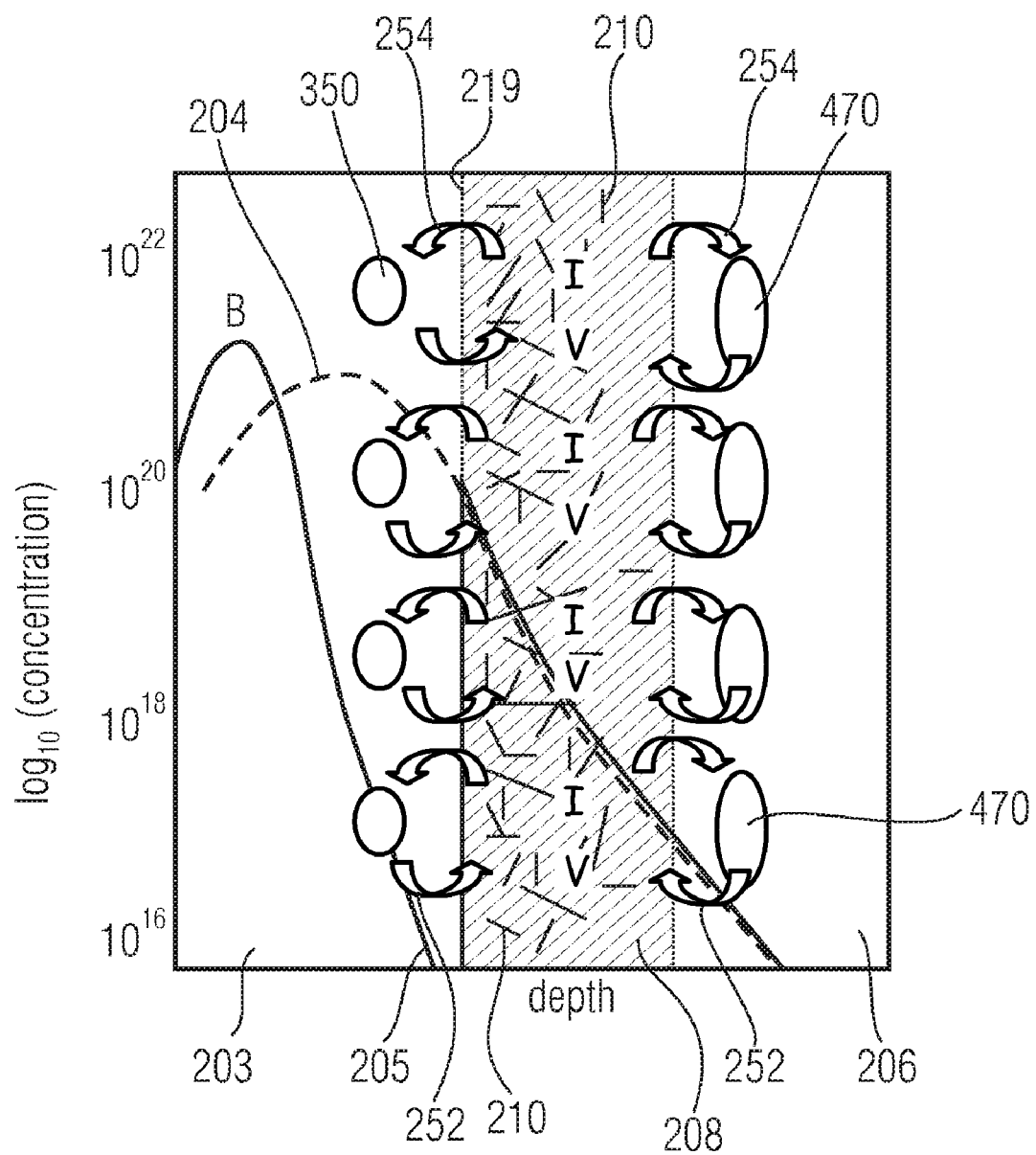
FIG. 14 shows a diagram depicting the elimination of interstitials by introduced micro-cavities in the crystalline silicon region and silicon carbide precipitates in the amorphous region according to another embodiment of the invention.

In FIG. 14 another embodiment of the inventive method for producing a semiconductor element is depicted. In this embodiment, the SiC precipitates 350 may be formed at a distance of about 10 nm from the amorphous/crystalline interface 219 in an amorphous region 203 of the substrate, while the micro-cavities 470 may be located in the crystalline region 206 of the substrate. The micro-cavities 470 and the SiC precipitates 350 serve again as sources of vacancies in the substrate and, thereby, serving as sinks for the interstitials 210, depicted by the arrows 252 and 254.

Figure 15:
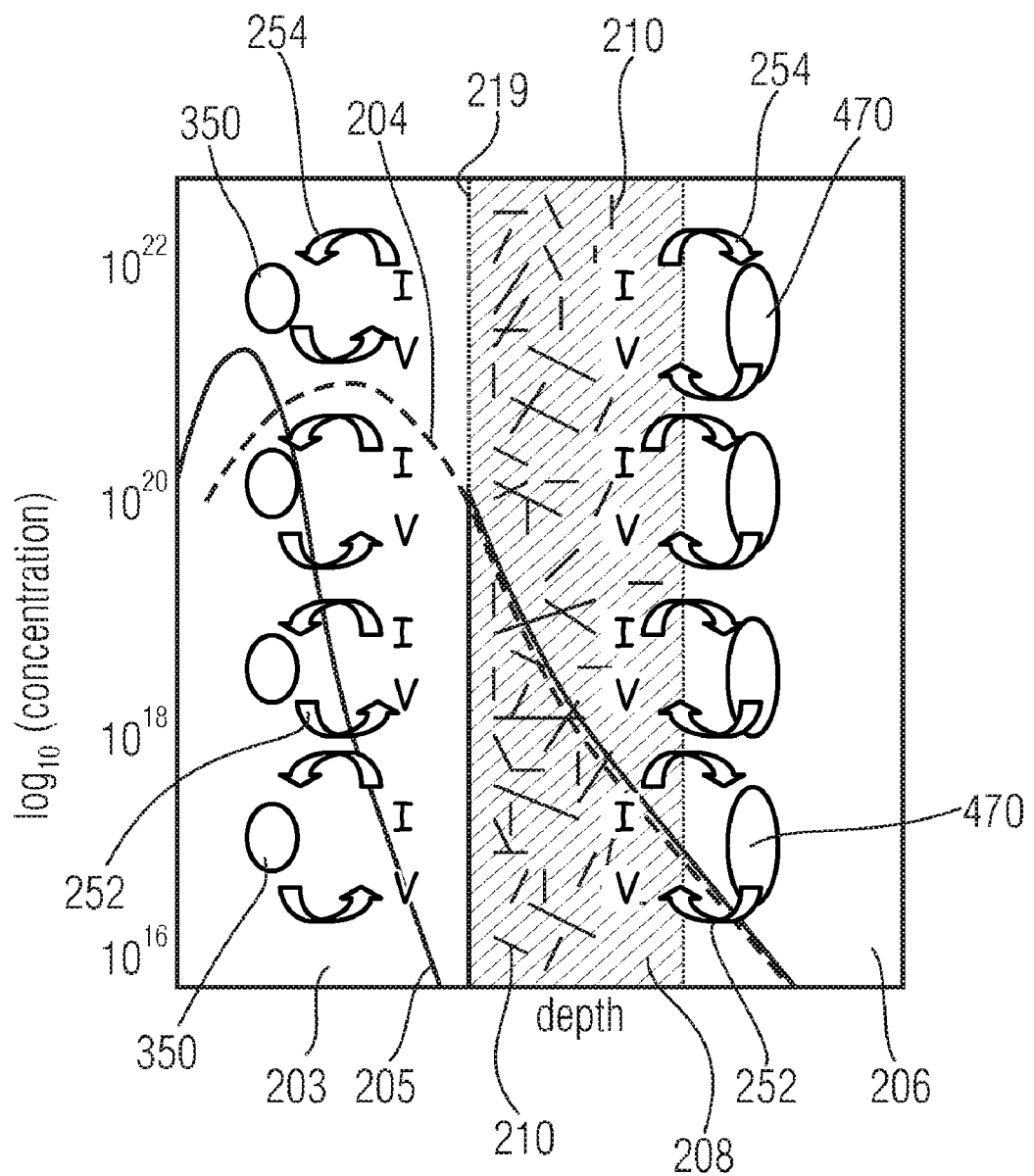
FIG. 15 shows a diagram depicting the elimination of interstitials by introduced micro-cavities in the crystalline silicon region and silicon carbide precipitates placed near a boron doping concentration peak in the amorphous region according to another embodiment of the invention.

Another embodiment of the method of producing a semiconductor element in a substrate is shown in FIG. 15. In this embodiment, the SiC precipitates may be created before the pre-amorphization, for example, with germanium ions. The SiC precipitates 350 or a band formed by the SiC precipitates may be placed near the maximum of the boron doping peak to be formed later, while micro-cavities or a band formed by the micro-cavities may be formed in the crystalline region 206 of the substrate. The SiC precipitates may be placed near the boron doping atom peak to be formed later, that means the SiC precipitate band may be, for example, placed about 50 nm to about 250 nm, also about 100 nm to about 200 nm in direction to the substrate surface 401 far from the amorphous/crystalline interface 219.

The micro-cavities 470 and the silicon carbide precipitates 350 may act again as effective sinks for the undesirable interstitials 210 by forming a source of a V, respectively releasing vacancies 252.

It should be noted that the micro-cavities 470, respectively the micro-cavity band may be formed first, followed by the forming of the SiC precipitate band in the substrate. But, it is also feasible, that the SiC precipitates band are formed first, followed by the forming of the micro-cavities 470 in the substrate. It should be avoided to place the micro-cavities 470 within the amorphous region 203 of the substrate, since they may disturb the re-crystallization process (SPER), following the pre-amorphization of the substrate.

Figure 16:
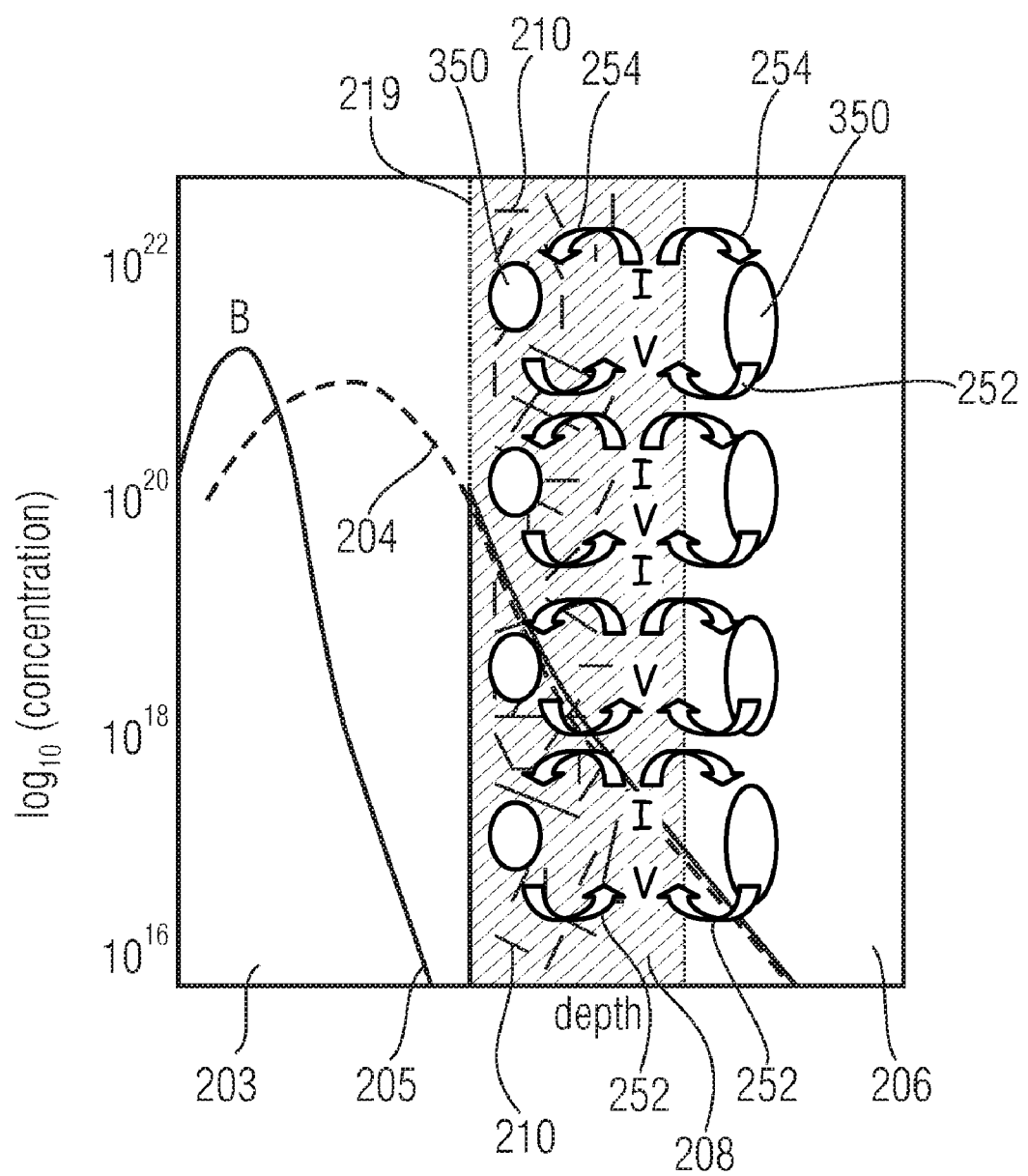
FIG. 16 shows a diagram depicting the elimination of interstitials by introducing two bands of silicon carbide precipitates according to an embodiment of the invention.

In FIG. 16, another embodiment of the method of producing a semiconductor element in a substrate is shown. In this embodiment, two bands of a plurality of carbide precipitates 350 placed at a certain distance to each other are formed in the substrate. The two SiC precipitate bands may be formed in the crystalline region beyond the amorphous/crystalline interface 219 of the substrate. The distance between the two bands may vary from about 0 nm to about 120 nm, or between about 70 nm and about 100 nm, for example, about 80 nm. The two SiC precipitate bands may be formed within local proximity to the interstitials 210, or rather the end of range defect zone 208 to be expected in being formed later, wherein the two bands of SiC precipitates are formed so close to the later formed interstitials 210 so as to serve as sinks for the interstitials 210. In other words, the interstitials type defects are dissolved effectively by means of the two bands formed by the SiC precipitates. This process is symbolized by arrows again 252 and 254. As mentioned above, the SiC precipitates form a source of vacancies, depicted by the arrows 252, which serve as sinks for the interstitials 210 as depicted by the arrows 254.

The average distance between the projected range Rp of the SiC precipitates 350 and the lower boundary of the amorphous region 203 in the direction of the depth of the substrate may be, for example, approximately about 10 nm to about 20 nm for the first SiC precipitate band and, for example, at a distance of 80 nm the second SiC precipitate band may be located.

It should be noted that it is also feasible, that two micro-cavity bands or regions are formed in the substrate in the above described way or it is also feasible that more than two bands of SiC precipitates or micro-cavities are formed within the substrate. Moreover, it is also feasible that the two bands of SiC precipitates are located in the substrate as described in context to the FIGS. 14 and 15.

It should be noted that the description of the location of the SiC precipitates and the SiC precipitate bands and the micro-cavities and micro-cavity bands in context with the described figures are referring to the projected range Rp. This reflects the fact that micro-cavities and carbide precipitates, which are formed in the substrate comprise a certain distribution regarding their depth in the substrate.

According to another embodiment the two SiC precipitate bands are spaced to each other. Spaced to each other may refer to the distance between the full width at half maximum of the respective vertical SiC distribution in the substrate.

SiC precipitate bands may be spaced between about 0 nm to about 120 nm, or between about 70 nm and about 100 nm, for example, about 80 nm. These may also apply to micro-cavities and respective micro-cavity bands.

In other words the term spaced to each other may refer to the distance at the full width at half maximum of the respective vertical distributions.

Figure 17:
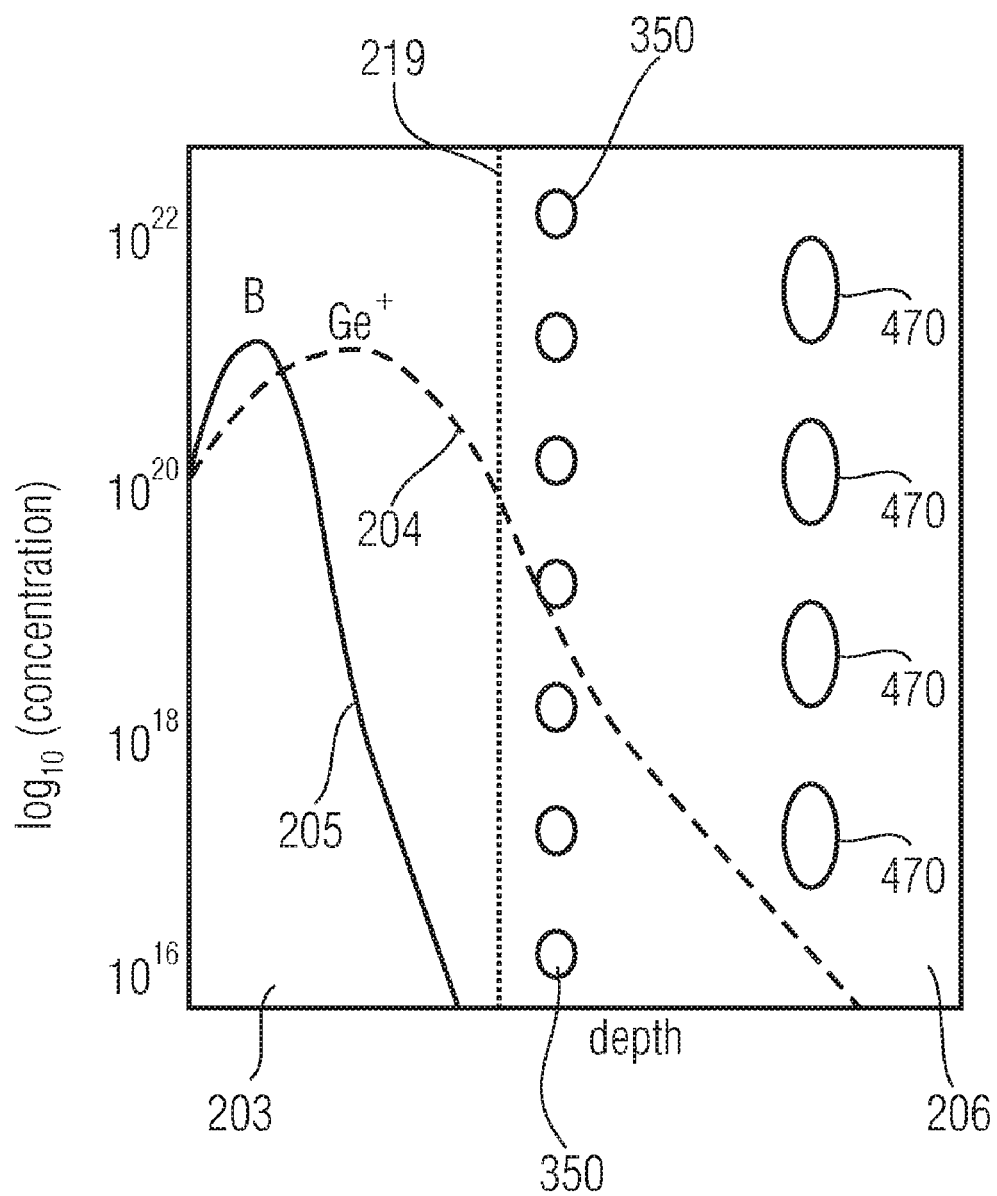
FIG. 17 shows schematically the final condition of the substrate after eliminating the interstitials by the micro-cavities and silicon carbide precipitates.

FIG. 17 shows the schematic final condition of a substrate after elimination the interstitial type defects 210 by means of SiC precipitates 350 and micro-cavities 470. It is assumed, that the micro-cavities 470 and the SiC precipitates 350 still remain after the elimination of the interstitial type defects in the substrate. The boron 205 and the germanium ions 204 doping profile, as well as the amorphized zone 203 and the crystalline zone 206 are still shown in FIG. 17.

According to another embodiment of the invention, during the above mentioned conservative ripening process, a micro-cavity band with a thickness of approximately 20 nm to approximately 100 nm is formed, wherein the micro-cavities comprise approximately a size of about 40 nm. The density of the micro-cavities may be approximately $10^{11}$ cm$^{-3}$.

A semiconductor element produced in a substrate according to the method can, for example, at least comprise one shallow junction in the substrate, wherein the shallow junction comprises doping atoms. Beneath the shallow junction, the above-mentioned micro-cavities and the carbide precipitates are formed in the substrate. The shallow junction is located relative to the main substrate surface. That means the doping atoms are implanted from the main substrate surface for forming the shallow junction. The process sequence of producing a semiconductor element in a substrate can be integrated into a conventional complementary metal oxide semiconductor (CMOS) process. As doping atoms, different types of doping atoms can be used on principle, for example, boron atoms, phosphorus atoms, or arsenic atoms. Furthermore, in addition, or as an alternative, fluoride atoms or carbon atoms may be used. These doping atoms can be, for example, implanted into the substrate or it is also feasible that the doping is performed in another way used in semiconductor processing. At least one region of the semiconductor element, in which regions of the doping atoms are implanted into the substrate, may form a shallow junction or an ultra-shallow junction of the semiconductor element relative to the main substrate surface. The semiconductor element may be formed as a transistor, for example, as a field effect transistor (FET).

In accordance with an embodiment of the invention, at least one region, within which the region of the doping atoms are implanted in the substrate, may form a source region or a drain region of the field effect transistor. Thus, a first region in which the doping atoms are implanted into the substrate may be formed as a source region of the field effect transistor and a second region, within which the doping atoms are implanted into the substrate, may be formed as a drain region of the field effect transistor. The substrate may be a silicon substrate, for example, an (100)-silicon substrate or a (111)-silicon substrate. It is feasible that in the context of the fabrication of a field effect transistor after forming the micro-cavities and the carbide precipitates, a gate insulation or, rather a gate dielectric can be formed, for example, a gate oxide layer on top of the channel region of the field effect transistor. However, it is also feasible that the gate dielectric is formed first and the micro-cavities and carbide precipitates afterwards. In this case, the gate dielectric can act as a mask and even after forming the micro-cavities by implanting ions or forming carbide precipitates by implanting, for example, carbon ions, the region beneath the gate dielectric may remain free of micro-cavities and carbide precipitates.

Figure 18A:
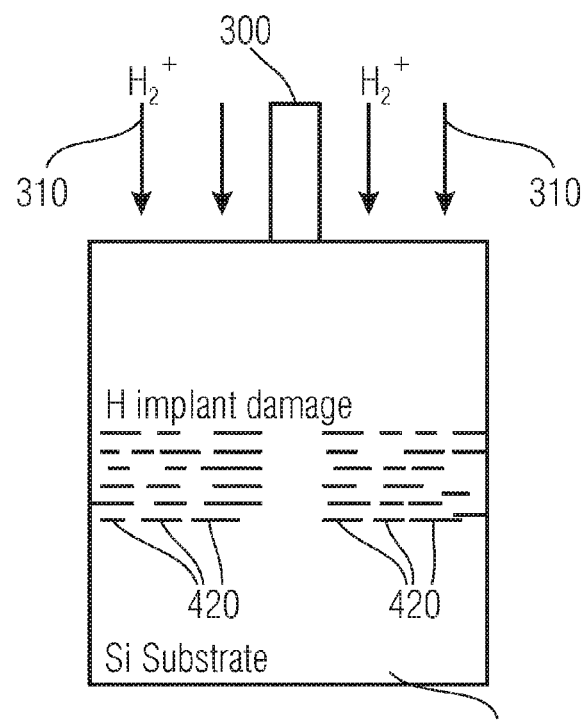
FIG. 18a shows an embodiment of the method for producing a semiconductor element in a first step of producing a field effect transistor with a preceding gate oxide deposition.

FIG. 18a depicts in a schematic diagram a substrate with micro-platelets 420 formed as small plates, whereas a gate structure 300 was formed before the micro-platelets 420 have been formed and therewith prior to the H$_2^+$-ions implantation 310. The H$_2^+$-ions 310 may be implanted exemplarily with an implantation dose $\phi=2\times10^{16}$ cm$^{-2}$ and with an implantation energy E=20 keV or alternatively with an implantation dose $\phi=1.3\times10^{16}$ cm$^{-2}$ and an implantation energy E=120 keV. The gate structures 300 may be formed in a conventional process step, by oxidizing the surface of the silicon substrate and depositing, for example, poly-silicon. By means of structuring the poly-silicon layer and the silicon oxide layer, the gate structure with the gate oxide and a gate electrode may be formed. The region beneath the gate structure 300 remains even after the H$_2^+$-ion implantation free of H$_2^+$-ions, since the gate structure 300 may act as a kind of mask during the H$_2^+$-ion implantation.

Figure 18B:
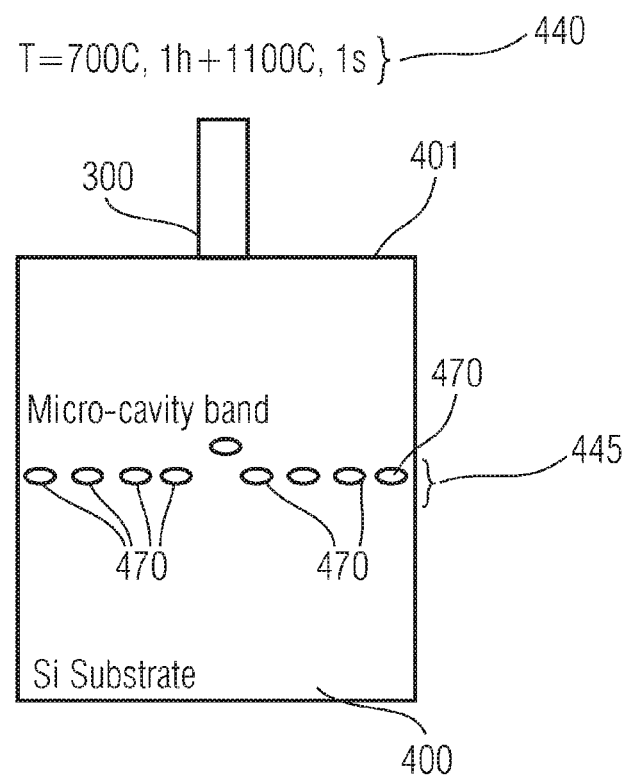
FIG. 18b shows as a further state in the production of the field-effect-transistor (FET) the forming of micro-cavity band.

FIG. 18b shows the semiconductor element after annealing it exemplarily for 1 hour at a temperature of 700° C. in order to diffuse out the H$_2^+$-ions and, for example, forming bigger micro-cavities 470 by annealing the small micro-platelets 420, for example, for 1 second at 1100° C. This process is described in more detail in context to FIG. 12. The parameter forming the micro-cavity band 445 may be chosen in such a way, that the location of the micro-cavity band 445 is within local proximity of interstitials 210, or rather the end of range defect zone 208 to be expected in being formed later (see FIG. 13).

Figure 18C:
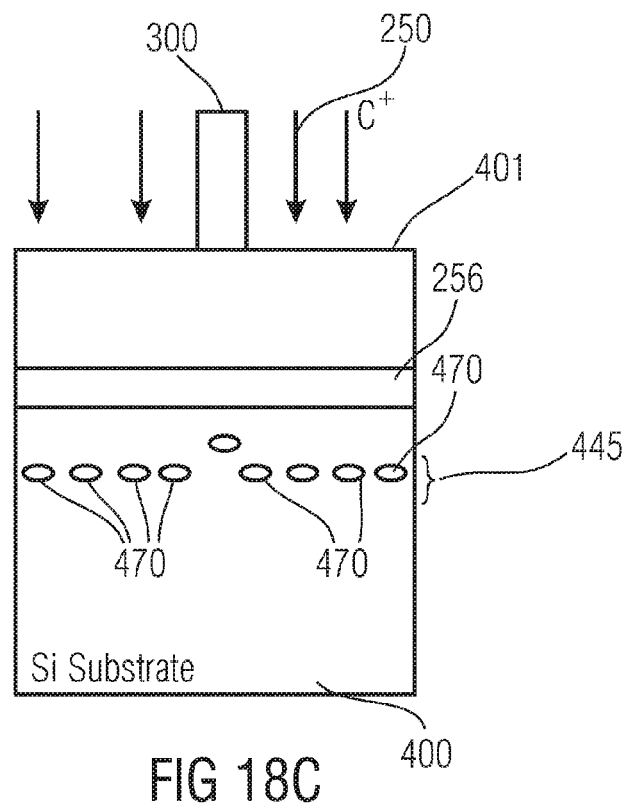
FIG. 18c shows as a further state in the production of the FET implantation of carbon ions forming a band above the micro-cavities.

In FIG. 18c, the implantation of carbon ions 250 into the semiconductor element is shown, for example, using an implantation dose $\phi=10^{16}$ cm$^{-2}$ and an implantation energy E=50 keV. By means of the implanted carbon ions 250, a high density or concentration of carbon atoms 256 is formed at a pre-determinable depth within the semiconductor element below the semiconductor surface 401. The concentration maximum of the implantation profile may be located at the so-called projected range Rp. In other words, implanted carbon atoms 256 are distributed in the semiconductor element around the concentration maximum. By means of a high dose carbon implant, both a high concentration of carbon atoms and a high concentration of interstitials can be formed within the silicon substrate or the semiconductor element. By means of the high concentration of both carbon atoms and self-interstitials, silicon carbide precipitation can be initiated in the silicon substrate. The gate structure 300 may be formed again as a mask for the carbon ion implantation.

Figure 18D:
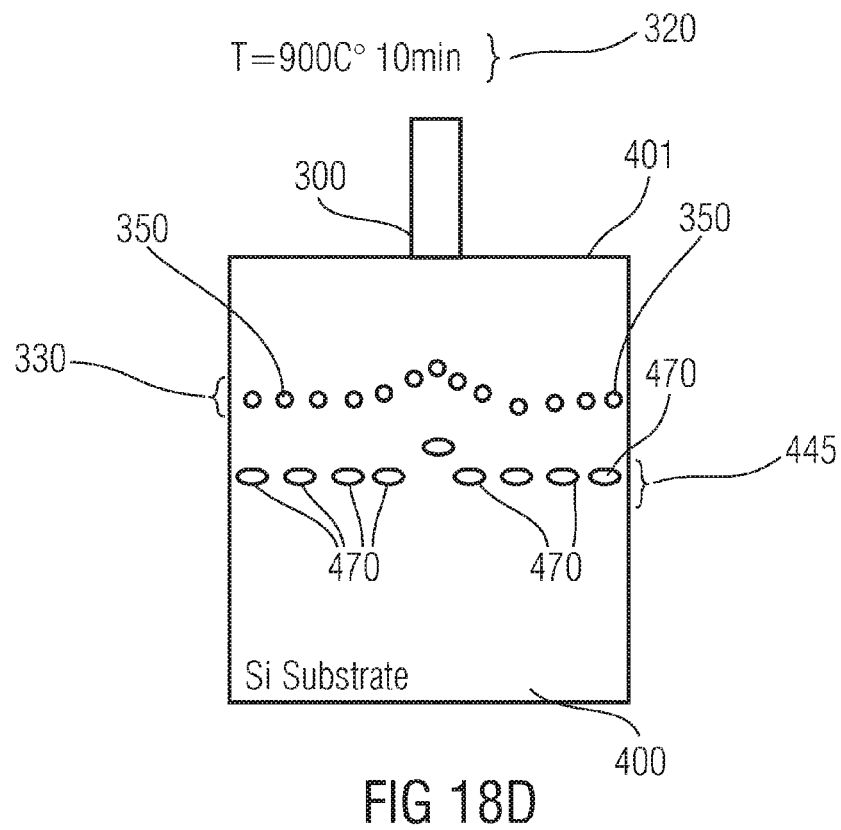
FIG. 18d shows as a further state in the production of a FET the forming of silicon carbide precipitate.

FIG. 18d shows the semiconductor element after a thermal treatment 320, for example, for 10 minutes at a temperature T=900° C. As it is described in context to the FIG. 11, by means of the thermal treatment, a network or band 330 of SiC precipitates 350 is formed within the semiconductor element at a depth, which corresponds to the projected range Rp. The precipitate band 330 includes a plurality of separated or isolated, in other words, not-connected, silicon carbide precipitates 350. The silicon carbide precipitate band may be formed at an amorphous/crystalline interface 219 in the end of range defect zone 208 to be expected in being formed later. The distance between the silicon carbide precipitates band 330 and the micro-cavity band 445 may be varied between about 0 nm to about 120 nm, for example, in this embodiment, it may be about 80 nm.

Figure 18E:
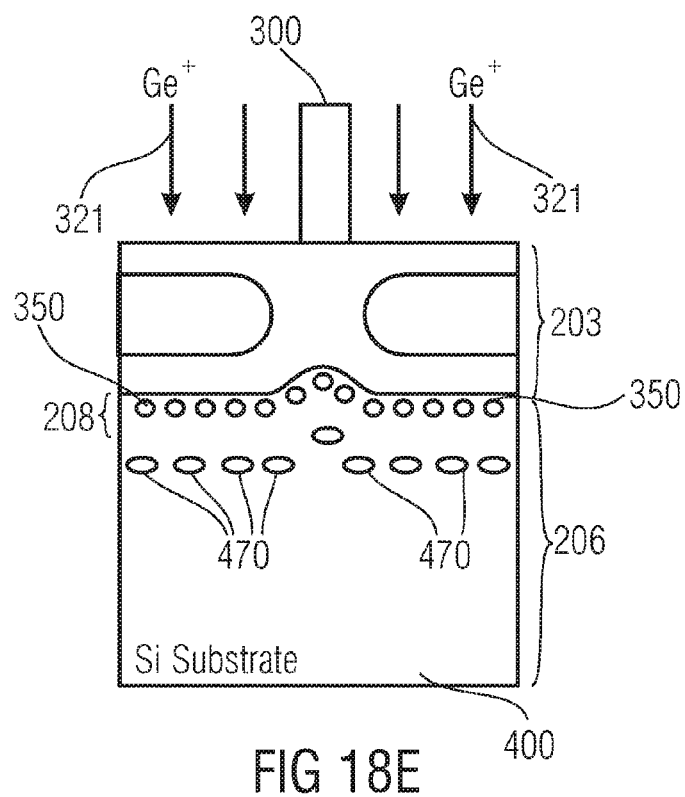
FIG. 18e shows as a further state in the production of the FET the pre-amorphization of a part of the substrate by germanium ions.

In FIG. 18e, the semiconductor substrate, will be amorphized in the surface region down to a depth from approximately 50 nm to approximately 200 nm, for example, down to the depth of approximately 100 nm, by implanting Ge$^+$-ions 321, so that the formal crystalline region of the semiconductor element comprises an amorphous region 203, which may extend approximately to the SiC precipitate band 330. The approximate distance between the SiC precipitate band 330 and the lower border of the amorphous region 203 may be about 10 to about 20 nm. In this embodiment of the invention, the germanium ions 321 may be implanted with an implantation energy of E=120 keV and an implantation dose of $\phi=10^{15}$ cm$^{-2}$.

Figure 18F:
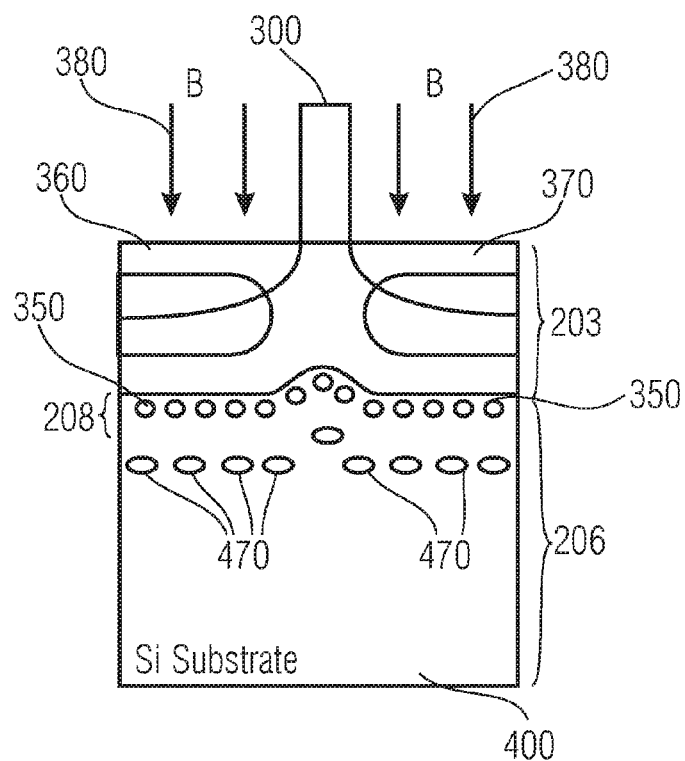
FIG. 18f shows as a further state in the production of the FET the doping of a source and drain region by boron atoms.

A source region 360 and a drain region 370 may be formed by using the gate structure 300 as a mask for a subsequent boron implantation 380 in the amorphous region 203 of the semiconductor element (see FIG. 18f). So, a field-effect-transistor (FET) comprising less interstitials than usually fabricated FETs, since the interstitials are dissolved by means of the silicon carbide precipitates and the micro-cavities. Additional transient enhanced diffusion, the boron deactivation and the uphill diffusion is reduced or eliminated in the FET as explained above.

It has to be noted that according to the embodiment shown in the FIGS. 18a-18f the forming of the micro-cavities 470 and the silicon carbide precipitates 350 is carried out before the pre-amorphization of the substrate, respectively the semiconductor element is formed.

According to the embodiment shown, the silicon carbide precipitate band can be integrated within a p-extension. According to one embodiment, the implant conditions of the carbon ion implantation may be chosen to include an implantation dose of, for example, about $10^{16}$ carbon ions per cm$^2$ and an implantation energy of, for example, about 50 keV, as well as a temperature of, for example, about T=900° C. and a time duration of, for example, about 10 minutes for the subsequent annealing step. According to one embodiment, the implant conditions for the germanium pre-amorphization step may include an implantation dose of, for example, about $10^{15}$ germanium ions per cm$^2$ and an implantation energy of, for example, about 60 keV. According to one embodiment, the implant conditions for the implantations of boron as dopant atoms may include an implantation dose of, for example, about $10^{15}$ boron atoms per cm$^2$ and an implantation energy of, for example, about 0.5 keV.

Figure 19:
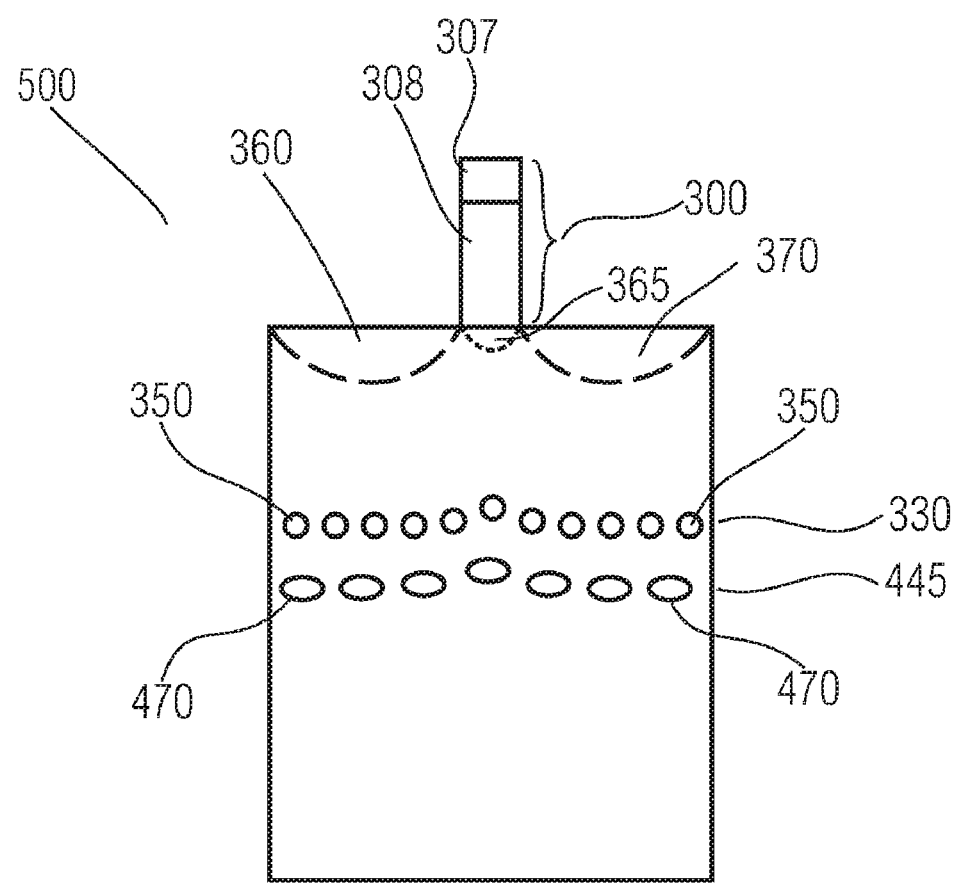
FIG. 19 shows a FET produced with the method of producing a semiconductor element in a substrate.

FIG. 19 shows a semiconductor element, in this case, a field effect transistor produced with the method for producing a semiconductor element in a substrate. The FET 500 comprises a gate structure 300 which is comprising a gate electron 307 may be made of poly-silicon and a gate oxide 308. Moreover, the semiconductor element comprises a source region 360 and a drain region 370. The source and the drain region may be formed as shallow junctions or ultra shallow junctions which comprise doping atoms, for example, boron, phosphorus, or arsenic atoms. Between the source 360 and the drain 370 of the field effect transistor, a channel region may be formed. The field effect transistor may comprise at a sufficiently large distance to the source 360, drain 370 and channel 365 region of the field effect transistor, silicon carbide precipitates so that those do not have any negative effect with respect to the performance of the field effect transistor. At a distance of approximately, for example, about 70 nm deeper in the substrate of the semiconductor element a band of micro-cavities 470 may be located. The field effect transistor may comprise less interstitial type defects in comparison to conventional field effect transistors. In this way, although uphill diffusion, transient enhanced diffusion of the doping atoms and the formed field effect transistor and the doping atom deactivation is reduced or eliminated compared to conventional field effect transistors.

Depending on whether the silicon carbide precipitates and the micro-cavities are formed before or after forming the gate structure 300, the silicon carbide precipitate band and the micro-cavity band may comprise an interrupted band structure, since parts of the semiconductor element beneath the gate structure during ion implantation to form carbide precipitates may be masked so that beneath the gate structure no carbide precipitates or micro-cavities are formed.

Figure 20A:
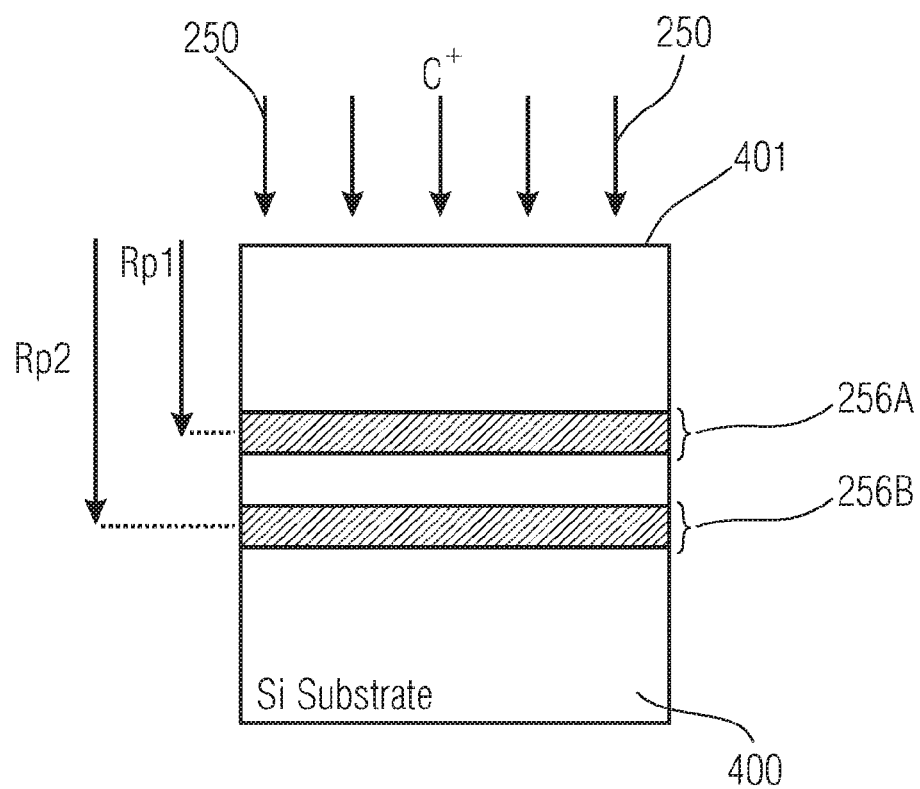
FIG. 20a shows as another embodiment of the method for producing a semiconductor element in a substrate a first state of producing a FET with two bands of silicon carbide precipitates formed before depositing a gate oxide.

In FIG. 20a another embodiment of the invention showing the formation of two silicon carbide precipitate bands spaced to each other is shown. The formation of the silicon precipitate bands can be, for example, integrated before the gate oxidation process, that means the implantation of the carbon ions 250 and the subsequent annealing step in order to form the silicon carbide precipitate band are carried out before the gate oxidation process. But it is also feasible to carry out first the gate oxidation. The method of producing a field effect transistor according to the embodiment described in the FIGS. 20a-20d is different from the embodiment shown in the FIGS. 19a-19f in that way, that the field effect transistor comprises, for example, two bands of silicon carbide precipitates 330a and 330b formed in the field effect transistor and the gate structure 300 is formed after the formation of the silicon carbide precipitate band 330a, 330b.

FIG. 20a shows the implantation of carbon ions with different implantation parameters in order to form two bands 256a and 256b, placed at a certain distance Rp1 and Rp2, spaced from each other, of a high concentration of carbon atoms and a high concentration of interstitials formed within the silicon substrate.

Figure 20B:
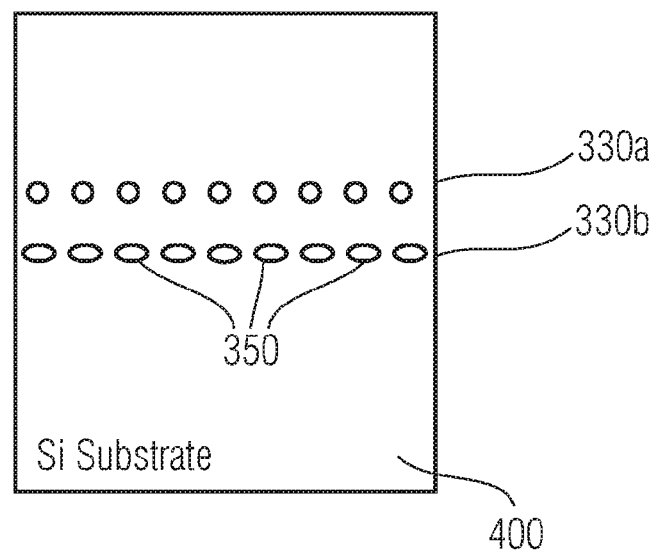
FIG. 20b shows as a further state in the production of the FET the forming of a silicon carbide precipitate band.

As it is shown in FIG. 20b, by applying a thermal treatment, for example, applying for about 10 minutes a temperature of about 900° C., two bands 330a and 330b of SiC precipitates are formed within the semiconductor element at a depth which corresponds to the projected range Rp of the respective carbon ion implantation. The distance between the two silicon carbide precipitate bands 330a and 330b may be, for example, about 80 nm.

Figure 20C:
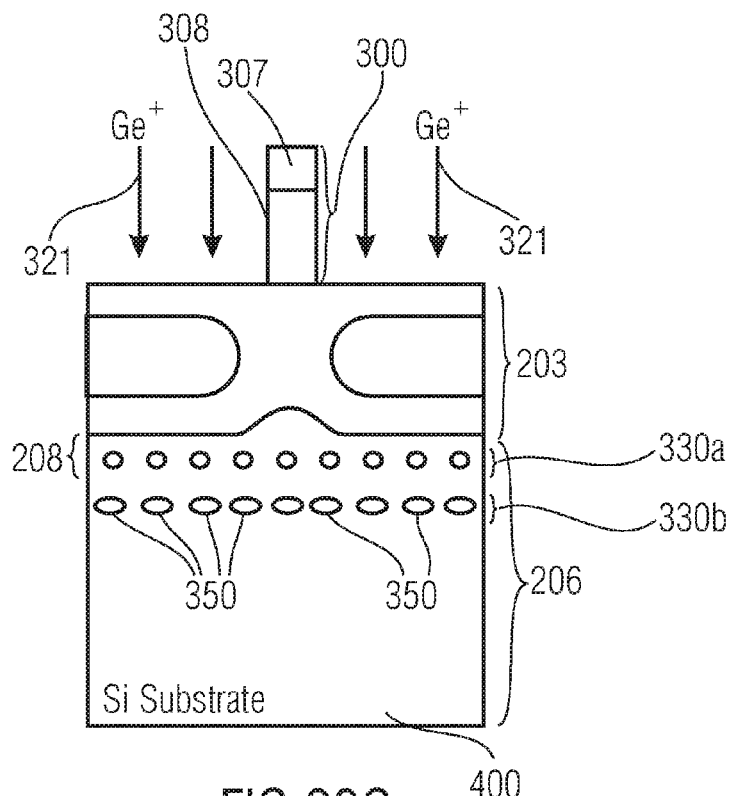
FIG. 20c shows as a further state in the production of the FET the pre-amorphization of the silicon substrate.
Figure 20D:
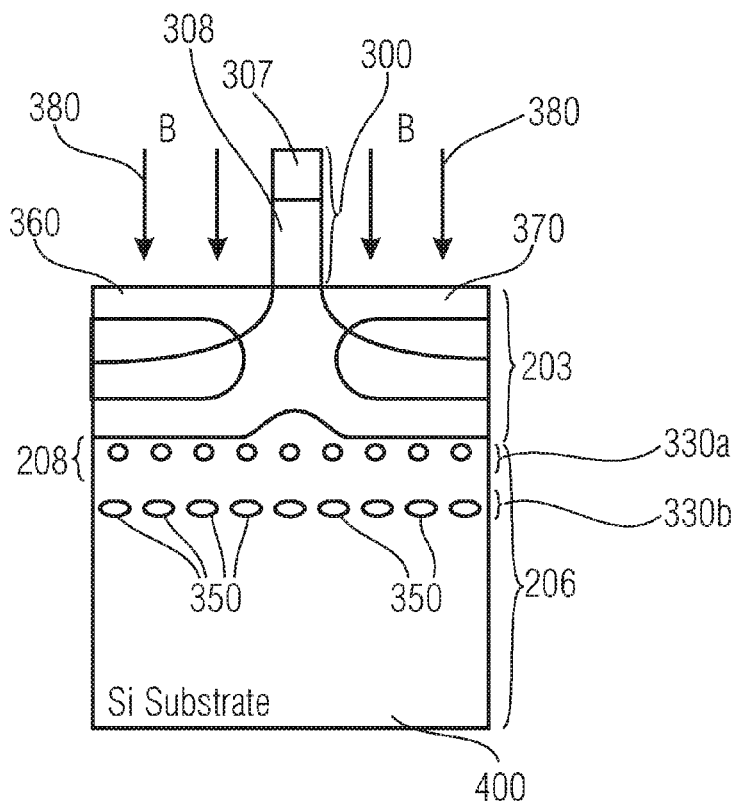
FIG. 20d shows as a further state in the production of the FET the forming of a source and drain region at the substrate by a doping with boron atoms.

After the formation of the SiC precipitate bands, the gate structure 300 is formed, for example, in that way that the main processing surface 401 of the semiconductor element is oxidized and a poly-silicon layer is formed thereon. By means of patterning the poly-silicon layer and the silicon oxide layers, the gate structure 300 with, the gate oxide 308 and the gate electrode 307 made of poly-silicon may be formed. Afterwards, as it is shown in FIG. 20c, the semiconductor element is subjected to pre-amorphization implantation. The semiconductor element is amorphized within its surface region, for example, up to a depth of approximately 50 nm to approximately 200 nm, e.g., approximately 100 nm, by means of introducing germanium ions 321, such that the silicon substrate, respectively, the semi-conducting element, which originally is a single crystalline substrate, now comprises a crystalline region 206 and an amorphous region 203 that extends approximately up to the first silicon carbide precipitate band 330a. An approximate distance between the silicon carbide precipitates 350 and the lower boundary 219 of the amorphous region 203 in the direction of the depth of the substrate may be, for example, approximately 10 nm to approximately 20 nm. The germanium ions 321 may be implanted using an implantation dose of, for example, $\phi=10^{15}$ cm$^{-2}$ and an implantation energy of, for example, E=60 keV.

Figure 21:
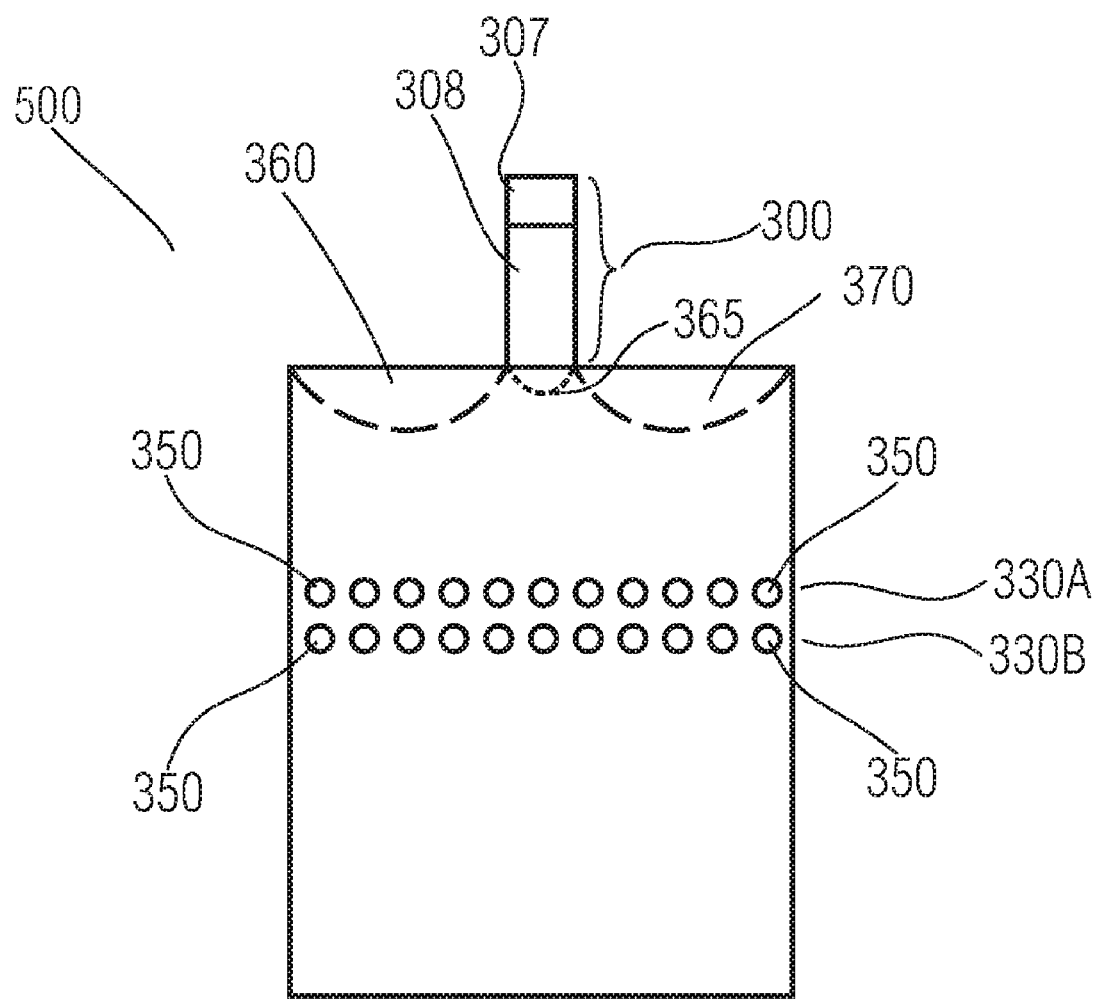
FIG. 21 shows a FET produced with the method of producing a semiconductor element in a substrate comprising two bands of silicon carbide precipitates.

Subsequently, by using the gate structure 300 as a mask, a source region 360 and a drain region 370 may be formed within the amorphous region 203 next to the gate structure 300 means of implanting, for example, boron atoms into the amorphous region 203. The implantation of boron may be carried out by using B$^+$-ions 380 as implantation ions during implantation. Having the source/drain regions 360, 370 in the amorphous region 203, clearly a field effect transistor 500, as it can be seen in FIG. 21 is accomplished. In comparison to conventional field effect transistors, the field effect transistor produced with the method described has less interstitial defects. Thus, the transient enhanced diffusion, the boron deactivation, and the uphill diffusion of the boron atoms may be reduced or eliminated compared to conventional field effect transistors.

Since the gate structure 300 was formed after creating the SiC precipitate bands 330a and 330b, the bands do not show an interruption of the band structure compared to those in FIGS. 18a-18f. Therefore, a field effect transistor produced as described comprise a continuous band structures of silicon carbide precipitates in the semiconductor element.

FIG. 21 shows again a semiconductor element, in this case, a field effect transistor, which is produced with the method of producing a semiconductor element in a substrate by means of SiC precipitate bands. In contrast to the semiconductor element depicted in FIG. 19, the field effect transistor in FIG. 21 comprises two bands 330a and 330b of SiC precipitates placed at a certain distance from each other, for example, by about 80 nm. The field effect transistor again comprises a source and drain region 360, 370 and a gate structure as described in context to the FIG. 19. In this context, the term "continuous" is to be understood that the SiC precipitates 350 are not only formed in regions below the source/drain regions 360, 370, but also in a region below the gate structure 300. Thus, there is no disturbance in the overall band structure of the two SiC precipitate bands 330a and 330b in contrast to the embodiment shown in FIGS. 18a-18f.

It is understood that it is possible to produce in the same way a semiconductor element, respectively, a field effect transistor with less interstitials compared to conventional field effect transistors by forming at least two or more bands of micro-cavities, in such a way, described in context to the forming of micro-cavities. The use of two bands of micro-cavities and/or silicon carbide precipitates make it possible to eliminate effectively the super saturation of interstitials.

To date, boron uphill diffusion of doping atoms, for example, boron atoms, has been treated as an inherent drawback of the SPER process. Therefore, an aspect of the invention is to effectively suppress uphill diffusion, transient enhanced diffusion and dopant deactivation during low temperature processing and insuring that all those detrimental phenomena also do not occur during further thermal processing of the semiconductor element. Uphill diffusion is not inherent to the SPER process in that it is possible under certain conditions to completely suppress it. It has been shown that the physical process leading to uphill diffusion is the migration of self-interstitials from the end of range regions, the end or range defect zones to the surface of the substrate. Since, for example, boron mainly diffuses by pairing with interstitials, a large flux of interstitials towards the surface will enable the boron atoms located at the tail of the concentration to diffuse against the gradient of boron concentration. Furthermore, the origin and the mechanism for boron deactivation and TED are also related to the source identified for the uphill diffusion. Therefore, a unified solution for suppressing the uphill diffusion, boron deactivation and avoiding the transient enhanced diffusion is possible. This may be achieved effectively by introducing, as described in embodiments of the invention, the combined use of micro-cavities and carbide precipitates in the substrate.

The importance of suppressing uphill diffusion and, as a direct consequence, boron loss, is quite high since it eliminates an element of instability to the process, which is particularly important when technology transfer is considered. For example, by reducing the boron loss, the high boron implanting process can be used for creating the highly doped p+/and ultra-shallow junctions could be reduced and, as a direct consequence, a considerable throughput increase. In particular, when low energy implant, for example, for boron 0.5 keV, are needed, high current beams are usually not easily achieved and, therefore, a reduction of a factor 10 in the dose will have a considerable impact on the overall implantation time. As it is shown above, suppressing uphill diffusion, transient enhanced diffusion, and boron deactivation by eliminating the source of interstitials located at the end of range region, namely the end of range defects, can be achieved by forming the above mentioned sinks of interstitials. The total elimination of end of range defects may be achieved by the combination of micro-cavity engineering and silicon carbide engineering or the use of at least two bands of a plurality of either micro-cavities or carbide precipitates placed at a certain distance from each other in the substrate.

In general, the method of producing a semi-conducting element in a substrate may comprise after creating both the micro-cavities and the carbide precipitates, a pre-amorphization, for example, with germanium, followed by, for example, a low energy p-type dopant implantation. The implanted species could be either boron, $BF_2$ or $B_xH_y$ clusters. Furthermore, the method may comprise a removal of a deposited screen oxide followed by a low temperature deposition, of a thin amorphous silicon layer at a temperature of approximately 450° C., wherein the layer may comprise a thickness of about 5 nm to about 100 nm and which is deposited with the aim to protect the dopant peak concentration, for example, the boron peak close to the surface of the semi-conducting element. The method may comprise a solid-phase epitaxial regrowth (SPER) at low temperatures (T≦600° C.) or with a temperature 600° C.<T<1000° C., which enables the re-crystallization of the amorphous layer without significant boron loss followed, for example, by conventional low TEOS and nitride spacer deposition. A high temperature laser or flash annealing (1200° C.<T<1350° C.) may be integrated in the process of record without the need of using an additional spike anneal treatment. The advantage of suppressing the source of interstitials is that it enables the equilibrium solubility to be quickly reached without creating, for example, boron interstitial clusters during the laser/flash anneal or any subsequent temperature process. The effective suppression of self-interstitials by the combined use of micro-cavities and carbide precipitates can enable to take full advantage of laser/flash annealing in creating highly activated layers and without introducing the well-known phenomena of boron deactivation during subsequent low temperature processes.

That means uphill diffusion, TED and boron deactivation can be suppressed during all temperature processes in device fabrication. Such temperature processes might be, for example, necessary during the nitride spacer construction, the RTP processes, laser/flash annealing processes or low temperature silicidation. By suppressing interstitial migration towards the surface by means of combined use of micro-cavities and silicon carbide precipitates or the use of at least two bands of either the micro-cavities or the silicon carbide precipitates. The flux of interstitials towards the surface is eliminated by the introduction of large sinks for interstitials in the region of high interstitial concentration by means of micro-cavity engineering and silicon carbide engineering. The same behavior as described above can be used to suppress phosphorus uphill diffusion, phosphorus transient enhanced diffusion and phosphorus deactivation. That means the above mentioned embodiments of the invention may be also applied to semiconductor elements comprising a doping with phosphorus atoms.

Furthermore, the method of producing a semiconductor element or the described semiconductor element may be formed in a substrate different to silicon. It may be formed in a gallium nitride, a silicon carbide, an indium phosphide, a gallium arsenide or any other semiconductor substrate.

While the invention has been shown and described with reference to the specific embodiments, it should be understood by those skilled in the art, that various changes in form and detail may be made without departing from the spirit and scope of the invention as defined by the appended claims. The scope of the invention is thus indicated by the appended claims and all changes that come within the meaning and range of equivalency of the claims are intended to embraced.

What is claimed is:

1. A method of forming a semiconductor element in a substrate, the method comprising:
    forming a plurality of micro-cavities and carbide precipitates in a substrate;
    creating an amorphization of the substrate to form crystallographic defects and a doping of the substrate with doping atoms;
    annealing the substrate, such that at least a part of the crystallographic defects is eliminated using the micro-cavities and the carbide precipitates; and
    forming a semiconductor element using the doping atoms.

2. The method according to claim 1, wherein forming the plurality of micro-cavities and carbide precipitates comprises implanting ions into the substrate.

3. The method according to claim 2, wherein $H_2^+$-, $He^+$-, $F^+$-, $Ne^+$-, $Cl^+$- or $Ar^+$-ions are used for implanting the micro-cavities and $C^+$-ions are used for implanting the carbide precipitates in the step of forming the plurality of micro-cavities and the carbide precipitates in the substrate, wherein doses used for implanting in the step of forming the plurality of micro-cavities and the carbide precipitates in the substrate lie between $1e15/cm^2$ and $1e18/cm^2$ and the energies used for implanting in the step of forming the plurality of micro-cavities and the carbide precipitates in the substrate lie between 5 keV and 150 keV.

4. The method according to claim 3, wherein forming the plurality of micro-cavities and carbide precipitates comprises a thermal treatment of the substrate, wherein the thermal treatment is performed to tune a size of the micro-cavities and/or to form the carbide precipitates.

5. The method according to claim 3, wherein forming at least two bands of a plurality of one of micro-cavities and carbide precipitates comprises a thermal treatment of the substrate wherein the thermal treatment is performed to tune a size of the micro-cavities and/or to form the carbide precipitates.

6. The method according to claim 1, wherein the plurality of micro-cavities and carbide precipitates are formed in such a way, that a band of micro-cavities and a band of carbide precipitates result, wherein the band of micro-cavities and the band of carbide precipitates are separated vertically with respect to one another.

7. The method according to claim 1, wherein the formation of the plurality of micro-cavities and carbide precipitates is performed such that the carbide precipitates are formed near an interface between a crystalline and an amorphous region of the substrate, resulting from the amorphization of the substrate, and the micro-cavities are formed in the crystalline region of the substrate, both in local proximity to crystallographic defects formed by the amorphization.

8. The method according to claim 1, wherein the formation of the plurality of micro-cavities and carbide precipitates is performed so that the plurality of micro-cavities are deeper located in the substrate than the plurality of carbide precipitates.

9. The method according to claim 1, wherein the formation of the plurality of micro-cavities and carbide precipitates is performed so that the plurality of carbide precipitates are formed in an amorphous region near an interface between a crystalline region of the substrate and an amorphous region of the substrate, resulting from the amorphization of the substrate, and the micro-cavities are formed in the crystalline region of the substrate, both in a local proximity to the crystallographic defects formed by the amorphization of the substrate.

10. The method according to claim 1, wherein the doping of the substrate is performed so that a maximum of a doping atom concentration is in local proximity to the carbide precipitates formed in an amorphous region near an interface between the crystalline region and the amorphous region of the substrate, resulting from the amorphization of the substrate and wherein the micro-cavities are located in a crystalline region in local proximity to crystallographic defects formed by the amorphization of the substrate.

11. The method according to claim 1, wherein a region within which the doping of the substrate with doping atoms is performed forms a shallow junction of the semiconductor element.

12. The method according to claim 1, wherein the semiconductor element comprises a field effect transistor.

13. The method according to claim 12, wherein a region within which a doping of the substrate with doping atoms is performed forms a source region or a drain region of the field effect transistor.

14. The method according to claim 1, wherein forming the plurality of micro-cavities and carbide precipitates is performed such that the micro-cavities comprise a width larger than 5nm and the carbide precipitates comprise a width larger than 4 nm.

15. The method according to claim 1, wherein forming the plurality of micro-cavities and carbide precipitates is performed such that carbide precipitates comprise an accumulation of pure carbon clusters or oxygen-atoms in the lattice of the substrate, and such that the micro-cavities form an artificial surface region within the substrate.

16. A method of forming a semiconductor element, the method comprising:
    forming at least two bands of a plurality of one of micro-cavities and carbide precipitates vertically spaced apart from each other in a substrate;
    creating an amorphization of the substrate to form crystallographic defects and a doping of the substrate with doping atoms;
    annealing the substrate, such that at least a part of the crystallographic defects is eliminated using the micro-cavities and the carbide precipitates; and
    forming a semiconductor element using the doping atoms.

17. The method according to claim 16, wherein the formation of the at least two bands of a plurality of one of micro-cavities and carbide precipitates is performed such that at least one band of one of the micro-cavities and carbide precipitates is formed near an interface between a crystalline and an amorphous region of the substrate, resulting from the amorphization of the substrate, and at least a second band of a plurality of one of micro-cavities and carbide precipitates is formed in the crystalline region of the substrate, both in local proximity to the crystallographic defects formed by the amorphization of the substrate.

18. The method according to claim 16, wherein the at least two bands of a plurality of one of micro-cavities and carbide precipitates is carbide precipitates, and the formation is performed such that at least one band of carbide precipitates is formed in an amorphous region near an interface between a crystalline region of the substrate and an amorphous region of the substrate, resulting from the amorphization of the substrate, and a at least second band of the carbide precipitates is formed in the crystalline region of the substrate, both in local proximity to the crystallographic defects formed by the amorphization of the substrate.

19. The method according to claim 16, wherein the at least two bands of a plurality of one of micro-cavities and carbide precipitates is carbide precipitates, and the doping is performed such that a maximum concentration of the doping atoms is formed in local proximity to at least one band of carbide precipitates in an amorphous region near an interface between a crystalline region and the amorphous region of the substrate, resulting from the amorphization of the substrate, and wherein at least a second band of carbide precipitates is formed in the crystalline region of the substrate in local proximity to crystallographic defects formed by the amorphization of the substrate.

20. The method according to claim 16, wherein creating the amorphization of the substrate is performed such that the substrate is amorphized merely partially in a vertical direction.

21. The method according to claim 16, wherein the semiconductor element comprises a field effect transistor with a region within which the doping of the substrate with doping atoms forms a source region or a drain region of the field effect transistor.

22. The method according to claim 16, wherein forming at least two bands of a plurality of one of micro-cavities and carbide precipitates is performed such that the at least two bands of a plurality of micro-cavities comprise micro-cavities with a width larger than 5 nm or such that the at least two bands of carbide precipitates comprise carbide precipitates with a width larger than 4 nm.

23. The method according to claim 16, wherein forming at least two bands of a plurality of one of micro-cavities and carbide precipitates is performed such that at least two bands of a plurality of micro-cavities comprise micro-cavities forming an artificial surface region within the substrate or such that the at least two bands of carbide precipitates comprise carbide precipitates comprising an accumulation of pure carbon clusters or oxygen-atoms in the lattice of the substrate.

24. A method of forming a semiconductor element, the method comprising:
forming a shallow junction in a substrate so that doping atoms are disposed in the shallow junction; and
forming a plurality of carbide precipitates and micro-cavities in the substrate below the shallow junction.

25. The method according to claim 24, wherein the plurality of carbide precipitates are formed near an interface between a crystalline and an amorphous region of the substrate and the plurality of micro-cavities are formed in the crystalline region of the substrate.

26. The method according to claim 24, wherein the plurality of micro-cavities are formed vertically deeper in the substrate than the plurality of carbide precipitates.

27. The method according to claim 24, wherein the plurality of carbide precipitates are formed in an amorphous region near an interface between an amorphous and a crystalline region of the substrate, and the plurality of the micro-cavities are formed in the crystalline region of the substrate.

28. The method according to claim 24, wherein the plurality of carbide precipitates are formed in a local proximity to a maximum concentration of the doping atoms in an amorphous region and the plurality of the micro-cavities are formed in a crystalline region of the substrate.

29. The method according to claim 24, wherein forming the plurality carbide precipitates and micro-cavities is performed such that the micro-cavities comprise a width larger than 5 nm and the carbide precipitates comprise a width larger than 4 nm.

30. A method of forming a semiconductor element, comprising:
forming a shallow junction in a substrate, the shallow junction including doping atoms; and
forming at least two bands of a plurality of one of micro-cavities or carbide precipitates formed in the substrate below the shallow junction.

31. The method according to claim 30, wherein the at least one shallow junction is formed within an amorphous region of the substrate.

32. The method according to claim 30, wherein the at least two bands of the plurality of one of micro-cavities and carbide precipitates are located near an interface between a crystalline and an amorphous region of the substrate and at least a second band of a plurality of one of micro-cavities and carbide precipitates is located in the crystalline region of the substrate.

33. The method according to claim 30, wherein forming at least two bands of a plurality of one of micro-cavities and carbide precipitates is performed such that the at least two bands of a plurality of micro-cavities comprise micro-cavities with a width larger than 5 nm or such that the at least two bands of carbide precipitates comprise carbide precipitates with a width larger than 4 nm.

* * * * *